United States Patent
Parsche et al.

(10) Patent No.: US 11,624,820 B2
(45) Date of Patent: Apr. 11, 2023

(54) RF PNT SYSTEM WITH EMBEDDED MESSAGING AND RELATED METHODS

(71) Applicant: EAGLE TECHNOLOGY, LLC, Melbourne, FL (US)

(72) Inventors: Francis E. Parsche, Palm Bay, FL (US); Emil G. Svatik, Micco, FL (US); William C. Adams, Jr., West Melbourne, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 490 days.

(21) Appl. No.: 16/383,789

(22) Filed: Apr. 15, 2019

(65) Prior Publication Data
US 2020/0326419 A1 Oct. 15, 2020

(51) Int. Cl.
| | |
|---|---|
| G01S 13/76 | (2006.01) |
| G01S 19/11 | (2010.01) |
| G01S 19/46 | (2010.01) |
| H03M 13/09 | (2006.01) |
| H04L 27/20 | (2006.01) |
| G01S 13/00 | (2006.01) |

(52) U.S. Cl.
CPC ............ *G01S 13/765* (2013.01); *G01S 19/11* (2013.01); *G01S 19/46* (2013.01); *H03M 13/09* (2013.01); *H04L 27/2082* (2013.01)

(58) Field of Classification Search
None
See application file for complete search history.

(56) References Cited

U.S. PATENT DOCUMENTS

| | | | |
|---|---|---|---|
| 3,870,999 A * | 3/1975 | Mathews ................ | G01S 1/24 |
| | | | 342/389 |
| 4,800,391 A | 1/1989 | Enge | |
| 4,821,038 A * | 4/1989 | Enge ..................... | G01S 1/24 |
| | | | 342/389 |
| 5,032,845 A | 7/1991 | Velasco | |
| 5,278,568 A | 1/1994 | Enge et al. | |
| 5,563,611 A | 10/1996 | McGann et al. | |
| 5,588,048 A | 12/1996 | Neville | |
| 5,805,689 A | 9/1998 | Neville | |
| RE36,111 E | 2/1999 | Neville | |
| 6,452,547 B1 | 9/2002 | Johannessen | |
| 6,928,265 B2 | 8/2005 | Johannessen | |

(Continued)

OTHER PUBLICATIONS

Dean, W. N., "Clarinet Pilgrim System", Magnavox, Fort Wayne, Indiana, Sep. 30, 1973 (Year: 1973).*

(Continued)

*Primary Examiner* — Bernarr E Gregory
(74) *Attorney, Agent, or Firm* — Allen, Dyer, Doppelt + Gilchrist, P.A.

(57) ABSTRACT

An RF PNT system may include LORAN stations. Each LORAN station may include a LORAN antenna, and a LORAN transmitter coupled to the LORAN antenna and configured to transmit a series of LORAN PNT RF pulses having a time spacing between adjacent LORAN PNT RF pulses. One or more of the LORAN stations may include a message embedding generator coupled to the LORAN transmitter and configured to generate message RF bursts based upon an input message, and with each message RF burst being in the time spacing between respective adjacent LORAN PNT RF pulses.

28 Claims, 17 Drawing Sheets

(56) References Cited

U.S. PATENT DOCUMENTS

| | | | |
|---|---|---|---|
| 7,782,983 B2 | 8/2010 | Parakh et al. | |
| 8,145,521 B2 | 3/2012 | Sah et al. | |
| 8,340,686 B2 | 12/2012 | Bartlett | |
| 8,359,643 B2* | 1/2013 | Low | H04L 9/40 |
| | | | 370/254 |
| 8,391,488 B2 | 3/2013 | Qiu et al. | |
| 8,515,843 B1 | 8/2013 | Sah et al. | |
| 8,565,169 B2 | 10/2013 | Tavildar et al. | |
| 8,643,540 B2 | 2/2014 | Pattabiraman et al. | |
| 8,643,544 B2 | 2/2014 | Taylor et al. | |
| 8,655,761 B2 | 2/2014 | Sah et al. | |
| 8,787,954 B2 | 7/2014 | Richardson et al. | |
| 8,797,214 B2 | 8/2014 | Taylor et al. | |
| 8,874,398 B2 | 10/2014 | Raghupathy et al. | |
| 8,917,209 B2 | 12/2014 | Krasner et al. | |
| 8,923,226 B2 | 12/2014 | Tavitdar et al. | |
| 9,057,606 B2 | 6/2015 | Wolf et al. | |
| 9,119,165 B2 | 8/2015 | Krasner et al. | |
| 9,176,217 B2 | 11/2015 | Krasner et al. | |
| 9,218,741 B2 | 12/2015 | Wu et al. | |
| 9,291,712 B2 | 3/2016 | Krasner et al. | |
| 9,372,266 B2 | 6/2016 | Krasner et al. | |
| 9,681,408 B2 | 6/2017 | Marshall | |
| 9,734,723 B1 | 8/2017 | Bruno et al. | |
| 9,763,063 B2 | 9/2017 | Kumar | |
| 9,801,153 B2 | 10/2017 | Raghupathy et al. | |
| 9,810,788 B2 | 11/2017 | Raghupathy et al. | |
| 9,860,718 B2 | 1/2018 | Kumar | |
| 9,903,954 B1 | 2/2018 | Farley | |
| 9,916,763 B2 | 3/2018 | Jenkins | |
| 9,948,452 B1 | 4/2018 | Pearson et al. | |
| 10,024,972 B2 | 7/2018 | Raghupathy et al. | |
| 2001/0033576 A1* | 10/2001 | Richards | H04L 27/00 |
| | | | 370/442 |
| 2002/0193946 A1 | 12/2002 | Turnbull | |
| 2003/0027527 A1 | 2/2003 | Johannessen | |
| 2003/0027577 A1* | 2/2003 | Brown | H04W 72/00 |
| | | | 455/445 |
| 2003/0214435 A1 | 11/2003 | Johannessen | |
| 2009/0146864 A1 | 6/2009 | Zank et al. | |
| 2010/0103989 A1* | 4/2010 | Smith | G01S 5/10 |
| | | | 375/150 |
| 2010/0269007 A1* | 10/2010 | Laviolette | H04L 1/0052 |
| | | | 714/752 |
| 2016/0334493 A1 | 11/2016 | Lee et al. | |
| 2017/0192102 A1 | 7/2017 | Wietfeldt | |
| 2021/0003661 A1* | 1/2021 | Xu | H04W 56/0015 |

OTHER PUBLICATIONS

Lo et al. "Loran Data Modulation: A Primer" IEEE A&E Systems Magazine vol. 22, No. 9 Sep. 2007 PART 2: Tutorials LO: pp. 21.

J.L, Howard "Loran Navagation System" May 1980 www.dtic.mil/dtic/tr/fulltext/u2/a085646.pdf pp. 85.

Lo et al. "Loran Data Modulation: Extensions and Examples" IEEE Transactions on Aerospace and Electronic Systems vol. 43, No. 2 Apr. 2007 https://web.stanford.edu/group/scpnt/gpslab/pubs/papers/Lo_IEEEAES_2007_Mar_2008.pdf pp. 17.

Kuhn et al. "Performance Analysis and Potential Improvements of the Loran Data Channel" Conference: Institute of Navigation, Annual Meeting, At Cambridge, MA: Apr. 2007; pp. 15.

U.S. Appl. No. 16/114,668, filed Aug. 28, 2018 Veytsman.

Erkin Cubukcu "Root Raised Cosine (RRC) Filters and Pulse Shaping in Communication Systems" https://ntrs.nasa.gov/archive/nasa/casi.ntrs.nasa.gov/20120008631.pdf May 18, 2012; pp. 30.

Peterson et al., "Enhanced Loran-C Data Channel Project", International Symposium on Integration of Loran-C/Eurofix and EGNOS/Galileo, Mar. 2000, pp. 1-13.

* cited by examiner

RF PNT SYSTEM WITH EMBEDDED MESSAGING AND RELATED METHODS

TECHNICAL FIELD

The present disclosure relates to the field of Precision Navigation and Timing (PNT) systems, and, more particularly, to bi-directional communication systems embedded within a PNT system and related methods.

BACKGROUND

With the rise of satellite based PNT systems such as the Global Positioning System (GPS), there has been relatively little development or investment in terrestrial-based PNT systems, such as eLORAN, until recently. A renewed interest in such systems has arisen as a backup to satellite based PNT systems, particularly since low frequency eLORAN signals are much less susceptible to jamming or spoofing compared to the relatively higher frequency GPS signals. As such, further developments in terrestrial based PNT systems such as eLORAN systems may be desirable in certain applications.

In some applications, the eLORAN system includes a low data rate Low Data Channel (LDC), which is used to broadcast, dynamic Additional Secondary Factor (ASF) corrections collected from multiple reference stations in the eLORAN coverage area. In these applications, the user is provided position accuracy of 6 to 20 m (95% confidence), assuming that the user can receive updated ASF correction values in timely fashion (i.e. about 2 to 5 minute update rates). In addition to broadcasting ASF correction values, the LDC can also include short unidirectional broadcast messages that are received by the user.

SUMMARY

Generally, an RF PNT system may comprise a plurality of LORAN stations. Each LORAN station may include a LORAN antenna, and a LORAN transmitter (coupled to the LORAN antenna) and configured to transmit a series of LORAN PNT RF pulses having a time spacing between adjacent LORAN PNT RF pulses. At least one of the plurality of LORAN stations may include a message embedding generator coupled to the LORAN transmitter and configured to generate a plurality of message RF bursts based upon an input message, and with each message RF burst being in the time spacing between respective adjacent LORAN PNT RF pulses.

Additionally, the message embedding generator may be configured to generate the plurality of message RF bursts to be uncorrelated from the series of LORAN PNT RF pulses. Each LORAN transmitter may be configured to transmit eight LORAN PNT RF pulses in a Group Repetition Interval (GRI), and the message embedding generator may be configured to generate the plurality of message RF bursts using a fixed frame arrangement based upon the GRI.

Also, generally, each LORAN transmitter may be configured to transmit eight LORAN PNT RF pulses in a GRI, and the message embedding generator may be configured to generate the plurality of message RF bursts using an adaptive frame arrangement based upon the GRI. The message embedding generator may be configured to generate the plurality of message RF bursts using quadrature phase shift keying modulation.

The at least one of the plurality of LORAN stations may include a first group of LORAN stations configured to transmit the plurality of message RF bursts in a synchronized arrangement with one another. The plurality of LORAN stations may comprise a second group of LORAN stations configured to relay the input message from a message source to the first group of LORAN stations to be modulated into the plurality of message RF bursts. The first group of LORAN stations may be configured to send an acknowledgement message back to the message source.

Moreover, the message embedding generator may be configured to generate an encrypted message based upon the input message and generate the plurality of message RF bursts based upon the encrypted message. The message embedding generator may be configured to generate the plurality of message RF bursts based upon a message format comprising a routing preamble, a message type preamble, an encryption code segment, a reply or do not reply instruction, a digitally encoded message based upon an input message from a message source, and at least one of a checksum and a cyclic redundancy check (CRC) of message bits.

The RF PNT system may further comprise a receiving device configured to receive at least the plurality of message RF bursts. The receiving device may also be configured to receive the series of LORAN PNT RF pulses.

Another aspect is directed to a LORAN station. The LORAN station may include a LORAN transmitter configured to transmit a series of LORAN PNT RF pulses having a time spacing between adjacent LORAN PNT RF pulses, and a message embedding generator coupled to the LORAN transmitter. The message embedding generator may be configured to generate a plurality of message RF bursts based upon an input message and with each message RF burst being in the time spacing between respective adjacent LORAN PNT RF pulses.

Another aspect is directed to a LORAN receiving device to be used with a LORAN station. The LORAN station may include a LORAN transmitter configured to transmit a series of LORAN PNT RF pulses having a time spacing between adjacent LORAN PNT RF pulses, and a message embedding generator coupled to the LORAN transmitter and configured to generate a plurality of message RF bursts based upon an input message, and with each message RF burst being in the time spacing between respective adjacent LORAN PNT RF pulses. The LORAN receiving device may include a LORAN receiving antenna, LORAN receiver circuitry coupled to the LORAN antenna and configured to recover the series of LORAN PNT RF pulses having the time spacing between respective adjacent LORAN PNT RF pulses, and message recovery circuitry coupled to the LORAN receiver circuitry and configured to recover the input message from the plurality of message RF bursts, with each message RF burst being in the time spacing between respective adjacent LORAN PNT RF pulses.

Yet another aspect is directed to a method for RF PNT and communication messaging. The method may comprise operating a plurality of LORAN stations, each LORAN station comprising a LORAN antenna, and a LORAN transmitter coupled to the LORAN antenna and configured to transmit a series of LORAN PNT RF pulses having a time spacing between respective adjacent LORAN PNT RF pulses. The method also may include operating at least one of the plurality of LORAN stations comprising a message embedding generator coupled to the LORAN transmitter and configured to generate a plurality of message RF bursts based upon an input message, and with each message RF burst being in the time spacing between respective adjacent LORAN PNT RF pulses.

DETAILED DESCRIPTION

Figure 1:
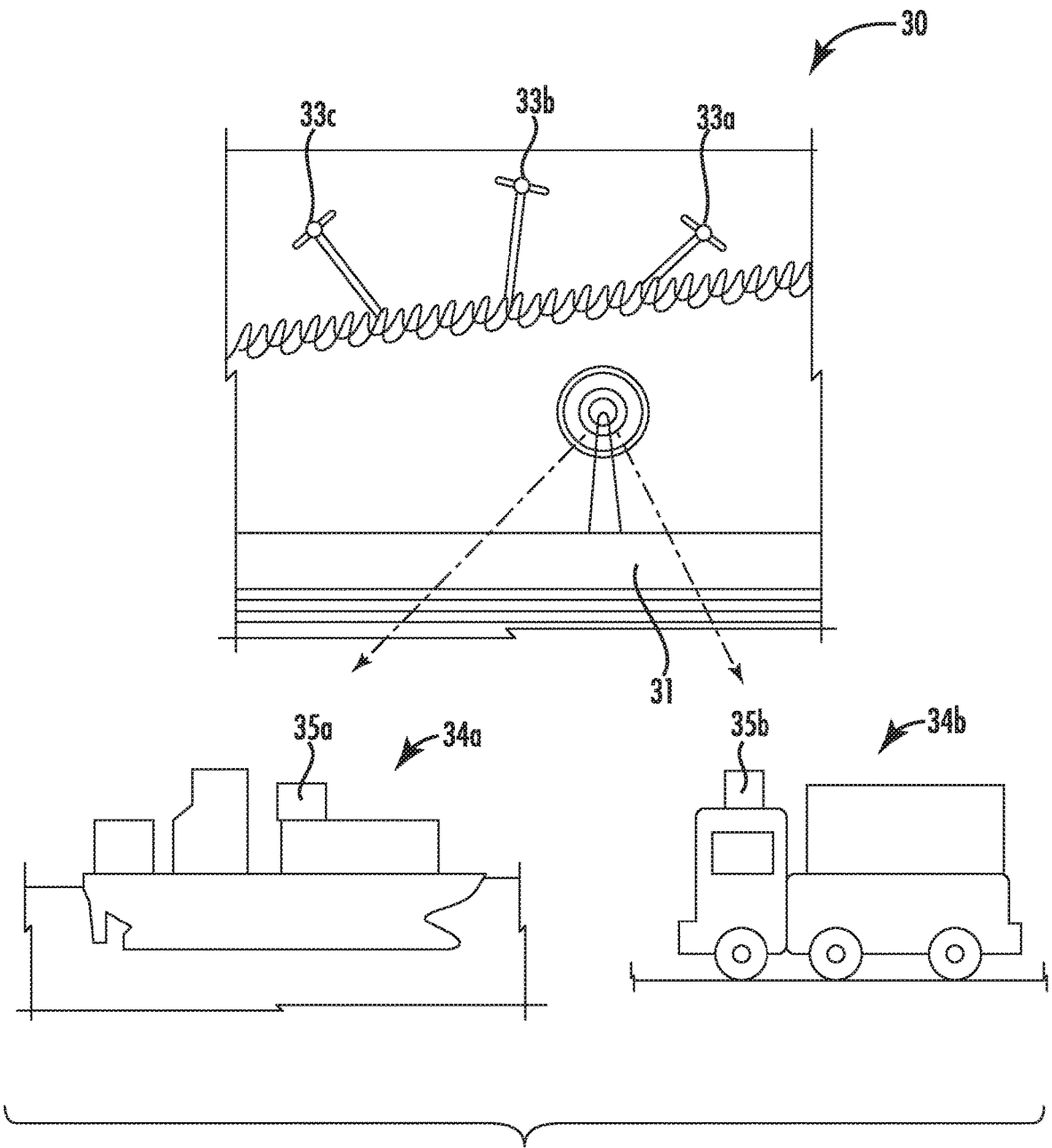
FIG. 1 is a schematic diagram of an LORAN communication system, according to the prior art.

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and base 100 reference numerals are used to indicate similar elements in alternative embodiments.

Figure 2:
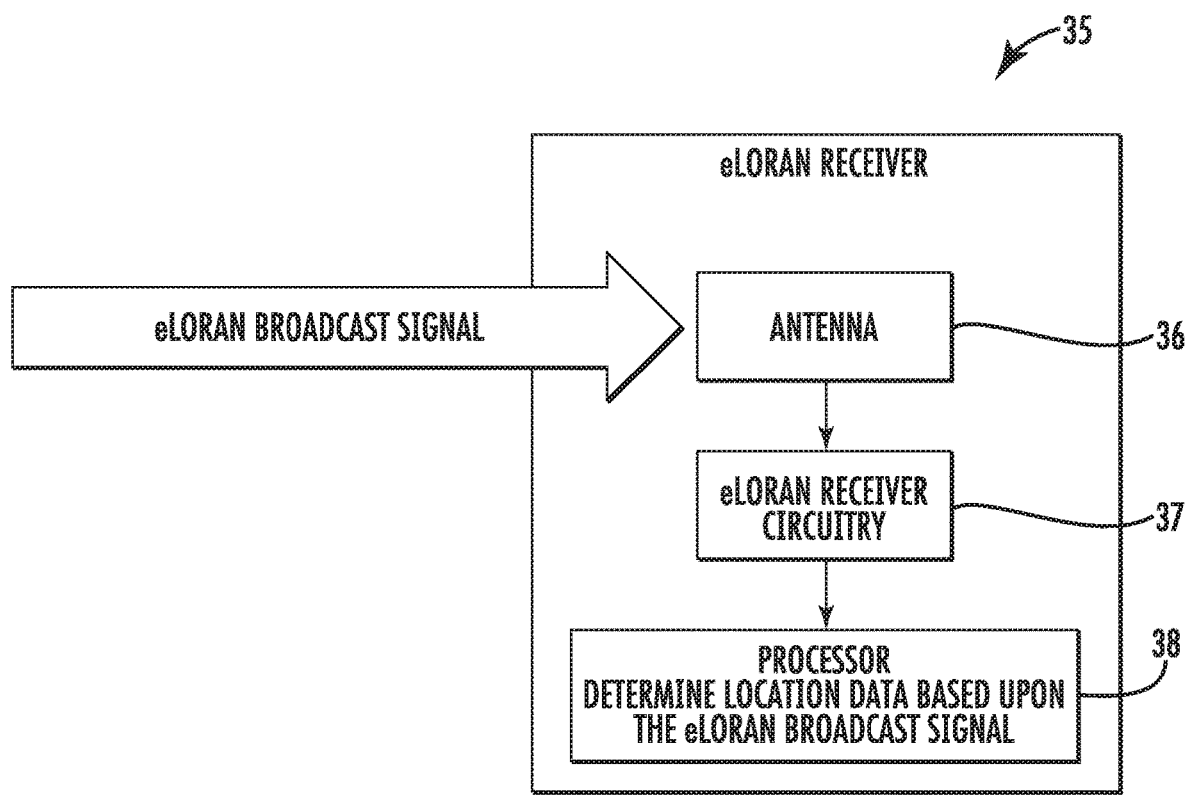
FIG. 2 is a LORAN receiver from the LORAN communication system of FIG. 1.
Figure 3:
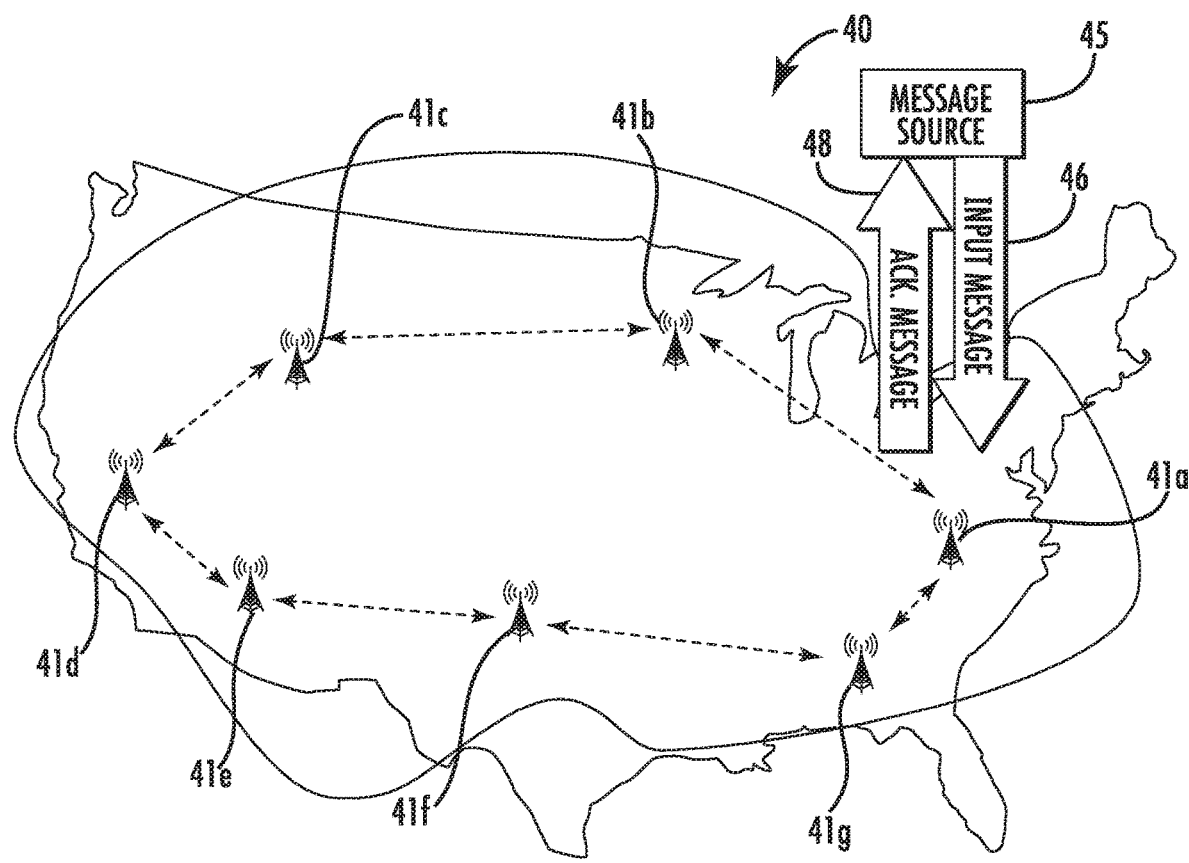
FIG. 3 is a schematic diagram of an RF PNT system, according to the present disclosure.

Referring initially to FIGS. 1-3, a LORAN PNT system 30, according to the present disclosure, is now described. The LORAN PNT system 30 illustratively includes a LORAN broadcast station 31 configured to transmit a LORAN broadcast signal.

Although not part of the LORAN PNT system 30, a plurality of GPS satellites 33a-33c is depicted. It should be appreciated that due to the low power and high frequency nature of GPS signals from the plurality of GPS satellites 33a-33c, the respective GPS signals are readily subject to natural and man-made interference (e.g., spoofing, jamming). Because of this, it may be helpful to provide bidirectional messaging communications capability embedded within the LORAN PNT system 30 as detailed herein.

The LORAN PNT system 30 illustratively includes a plurality of vehicles, 34a-34b and dismounted personal (not shown). Each of the plurality of vehicles 34a-34b and dismounted users illustratively includes a LORAN receiver 35a-35b configured to receive and process the LORAN broadcast signal.

Each LORAN receiver 35a-35b illustratively includes an antenna 36 and LORAN receiver circuitry 37 coupled thereto. The LORAN receiver 35a-35b illustratively includes a processor 38 coupled to the LORAN receiver circuitry 37 and configured to determine position and provide timing data based upon the LORAN broadcast signal.

Figure 4:
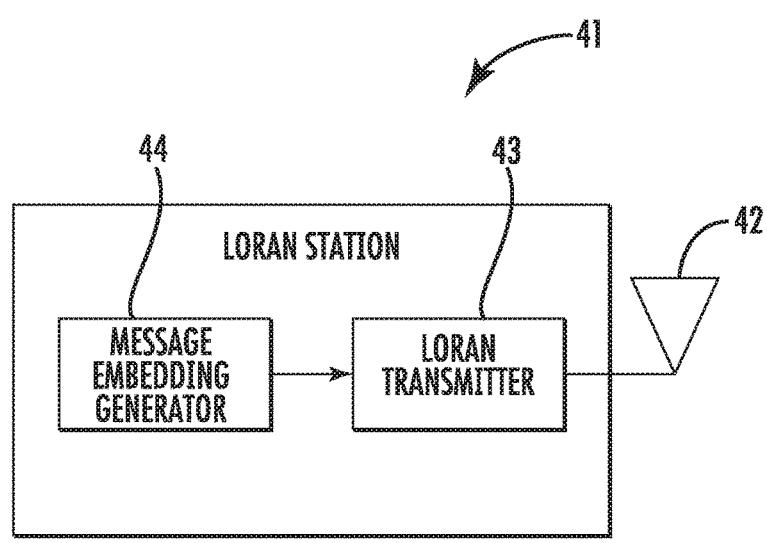
FIG. 4 is a schematic diagram of a LORAN station from the RF PNT system of FIG. 3.

Referring now to FIGS. 3-4, an RF PNT system 40 according to the present disclosure is now described.

The RF PNT system 40 illustratively comprises a plurality of LORAN stations 41a-41g. Each LORAN station 41a-41g illustratively includes a LORAN antenna 42 (e.g., a LORAN broadcast tower of suitable size), and a LORAN transmitter 43 coupled to the LORAN antenna and configured to transmit a series of LORAN PNT RF pulses having a time spacing between adjacent LORAN PNT RE pulses. The RE PNT system 40 may implement one or more of a plurality of LORAN communication standards, for example, eLORAN, LORAN-A, LORAN-B, and LORAN-C. As will be appreciated, the series of LORAN PNT RE pulses are used by a LORAN device to determine the position/location data.

The plurality of LORAN stations 41a-41g may comprise a subset of LORAN stations. Within this subset, each LORAN station 41a-41g includes a message embedding generator 44 coupled to the LORAN transmitter 43 and configured to generate a plurality of message RF bursts based upon an input message 46, received from an adjacent LORAN Station, User watercraft, User ground static/mobile platform or dismounted user. Each message RE burst is positioned in the time spacing between respective adjacent LORAN PNT RE pulses. In most embodiments, each and every LORAN station 41a-41g includes the message embedding generator 44 and the capability to modulate and transmit the input message 46. Each of the series of LORAN PNT RF pulses may be within a 90-110 kHz frequency range. The pulsed signal includes a 100 kHz carrier frequency. The series of LORAN PNT RF pulses comprises groups of 8 pulses with 1 ms spacing, and the transmission of groups repeats every GRI.

Additionally, the message embedding generator 44 is configured to generate the plurality of message RF bursts to be uncorrelated from the series of LORAN PNT RF pulses. Each LORAN transmitter 43 is configured to transmit eight LORAN PNT RF pulses in a GRI, and the message embedding generator 44 is configured to generate the plurality of message RF bursts using a fixed frame arrangement based upon the GRI.

For example, each of the plurality of message RF bursts may be modulated and error corrected using one or more of the following standards/codes: phase-shift keying (PSK); M-ary quadrature amplitude modulation (M-QAM) (e.g., 64-QAM); minimum-shift keying (MSK); frequency shift keying (FSK); spread frequency shift keying (SFSK); quadrature phase shift keying (QPSK) or Gaussian Minimum Shift Keying (GMSK), the most power efficient modulation; low-density parity-check (LDPC) code; Reed Solomon (RS) code; or other forward error correction (FEC) code. Also, each LORAN transmitter 43 is configured to transmit eight LORAN PNT RF pulses in a GRI, and the message embedding generator 44 is configured to generate the plurality of message RF bursts using an adaptive frame arrangement based upon the GRI. The message embedding generator 44 is configured to generate the plurality of message RF bursts using QPSK modulation or some other type of modulation (e.g., M-QAM, GMSK).

The plurality of LORAN stations 41a-41g illustratively includes a first group of LORAN stations configured to transmit the plurality of message RF bursts in a synchronized arrangement with one another. The plurality of LORAN stations 41a-41g illustratively comprises a second group of LORAN stations configured to relay the input message 46 from a message source 45 to the first group of LORAN stations to be modulated into the plurality of message RF bursts (i.e. an organized relay system). In other words, each station in the second group of LORAN stations includes the message embedding generator 44. The second group of LORAN stations Message demodulate the input message 46, then remodulate the input message on the transmission waveform at that station.

The first group of LORAN stations is configured to send an acknowledgement message 48 back to the message source 45. Helpfully, the message source 45 knows the RF PNT system 40 has received and relayed the input message 46. The message source 45 may comprise a mobile vehicle platform, such as an aircraft platform.

Figure 5:
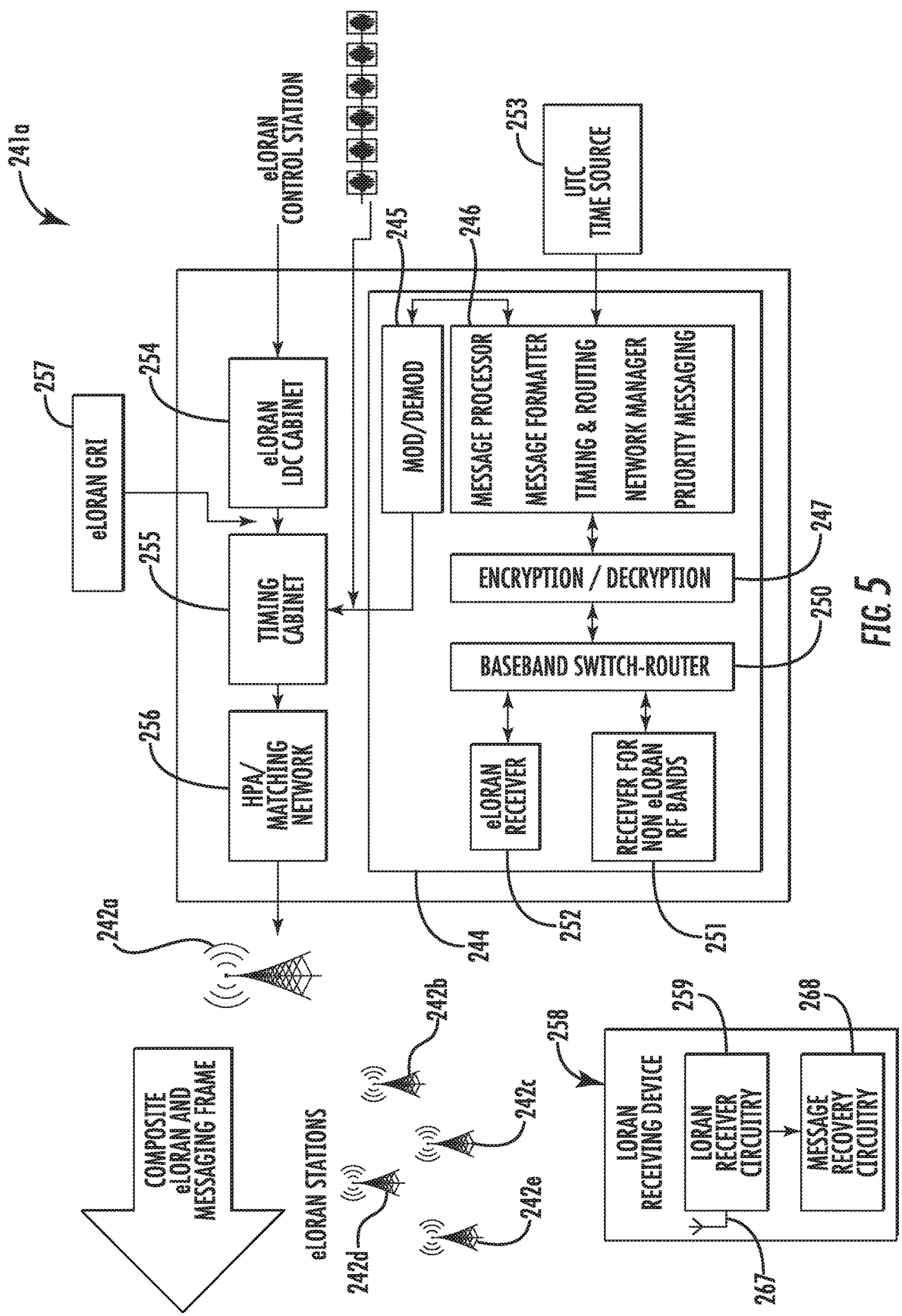
FIG. 5 is a detailed schematic diagram of an example embodiment of the LORAN station and a LORAN receiving device from the RF PNT system of FIG. 3.

Moreover, the message embedding generator 44 is configured to generate an encrypted message based upon the input message 46 and generate the plurality of message RF bursts based upon the encrypted message. The RF PNT system 40 illustratively comprises a LORAN receiving device (258: FIG. 5) configured to receive at least the plurality of message RF bursts. The LORAN receiving device 258 is configured to receive the series of LORAN PNT RF pulses and embedded message RF pulses.

As will be appreciated, the message source 45 may transmit and relay the input message 46 to LORAN receiving devices within range of the RF PNT system 40. Given the broadcast range and transmit power of the plurality of LORAN stations 41a-41g, the input message 46 may relayed over long distances, such as the illustrated cross-country range.

Another aspect is directed to a LORAN station 41a-41g. The LORAN station 41a-41g includes a LORAN transmitter 43 configured to transmit a series of LORAN PNT RF pulses having a time spacing between adjacent LORAN PNT RF pulses, and a message embedding generator 44 coupled to the LORAN transmitter. The message embedding generator 44 is configured to generate a plurality of message RF bursts based upon an input message 46 and with each message RF burst being in the time spacing between respective adjacent LORAN PNT RF pulses.

Yet another aspect is directed to a method for RF (PNT) and messaging. The method comprises operating a plurality of LORAN stations 41a-41g. Each LORAN station 41a-41g comprises a LORAN antenna 42, and a LORAN transmitter 43 coupled to the LORAN antenna and configured to transmit a series of LORAN PNT RF pulses having a time spacing between respective adjacent LORAN PNT RF pulses. The method also includes operating at least one of the plurality of LORAN stations 41a-41g comprising a message embedding generator 44 coupled to the LORAN transmitter and configured to generate a plurality of message RF bursts based upon an input message 46, and with each message RF burst being in the time spacing between respective adjacent LORAN PNT RF pulses.

Referring now additionally to FIG. 5, another embodiment of the LORAN station 241a is now described. In this embodiment of the LORAN station 241a, those elements already discussed above with respect to FIGS. 1-4 are incremented by 200 and most require no further discussion herein. This embodiment differs from the previous embodiment in that this LORAN station 241a illustratively includes a message embedding generator 244 comprising a modulator/demodulator module 245, a message processor module 246 cooperating with the modulator/demodulator module, an encryption/decryption module 247 coupled to the message processor module, and a baseband switch router 250 coupled to the encryption/decryption module.

The message embedding generator 244 illustratively comprises a receiver 251 configured to receive non-LORAN RF frequency bands (e.g. UHF, VHF), a LORAN receiver 252 coupled to the baseband switch router 250, and a Universal Time Coordinated (UTC) time source module 253 configured to provide a time value to the message processor module 246. The LORAN station 241 illustratively includes an LDC module 254, a timing module 255 coupled downstream from the LDC module, a matching network 256 coupled downstream from the timing module, and a LORAN broadcast antenna 242a coupled downstream from the matching network. Also, the LORAN station 241 illustratively includes a LORAN GRI module 257 configured to generate the GRI upstream of the timing module 255.

Once the input message has been properly encrypted, the message processor module 246 is configured to send the encrypted message to the modulator/demodulator module 245, which is configured to generate the plurality of message RF bursts. The modulator/demodulator module 245 is configured to send the plurality of message RF bursts to the timing module 255 for combination with the GRI.

A LORAN receiving device 258 is to be used with the LORAN station 241a. The LORAN station 241a includes a LORAN transmitter (i.e. the LORAN broadcast antenna 242a) configured to transmit a series of LORAN PNT RF pulses having a time spacing between adjacent LORAN PNT RF pulses, and a message embedding generator 244 coupled to the LORAN transmitter and configured to generate a plurality of message RF bursts based upon an input message, and with each message RF burst being in the time spacing between respective adjacent LORAN PNT RF pulses. The LORAN receiving device 258 includes a LORAN receiving antenna 267, LORAN receiver circuitry 259 coupled to the LORAN antenna and configured to recover the series of LORAN PNT RF pulses having the time spacing between respective adjacent LORAN PNT RF pulses, and message recovery circuitry 268 coupled to the LORAN receiver circuitry and configured to recover the input message from the plurality of message RF bursts, with each message RF burst being in the time spacing between respective adjacent LORAN PNT RF pulses.

Figure 6:
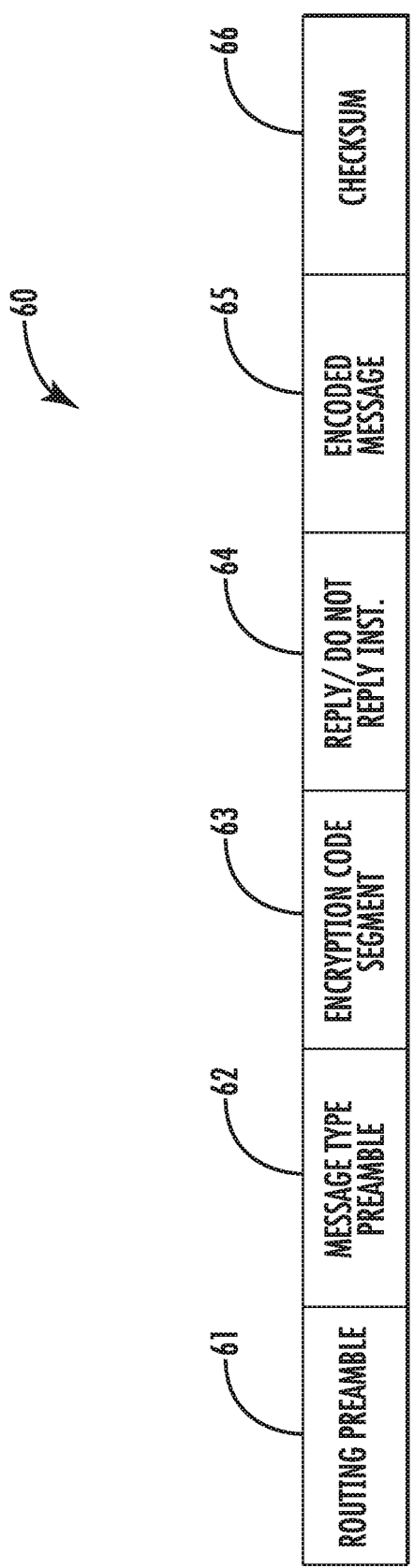
FIG. 6 is a diagram of a frame structure in the RF PNT system of FIG. 3.

Referring now additionally to FIG. 6, a frame structure 60 for the input message 46 (FIG. 3) is shown. The message embedding generator 44 is configured to generate the plurality of message RF bursts based upon a message format comprising a routing preamble 61, a message type preamble 62, an encryption code segment 63, a reply/do not reply instruction 64, a digitally encoded message 65, and at least one of a checksum and a CRC of message bits 66.

Figure 7:
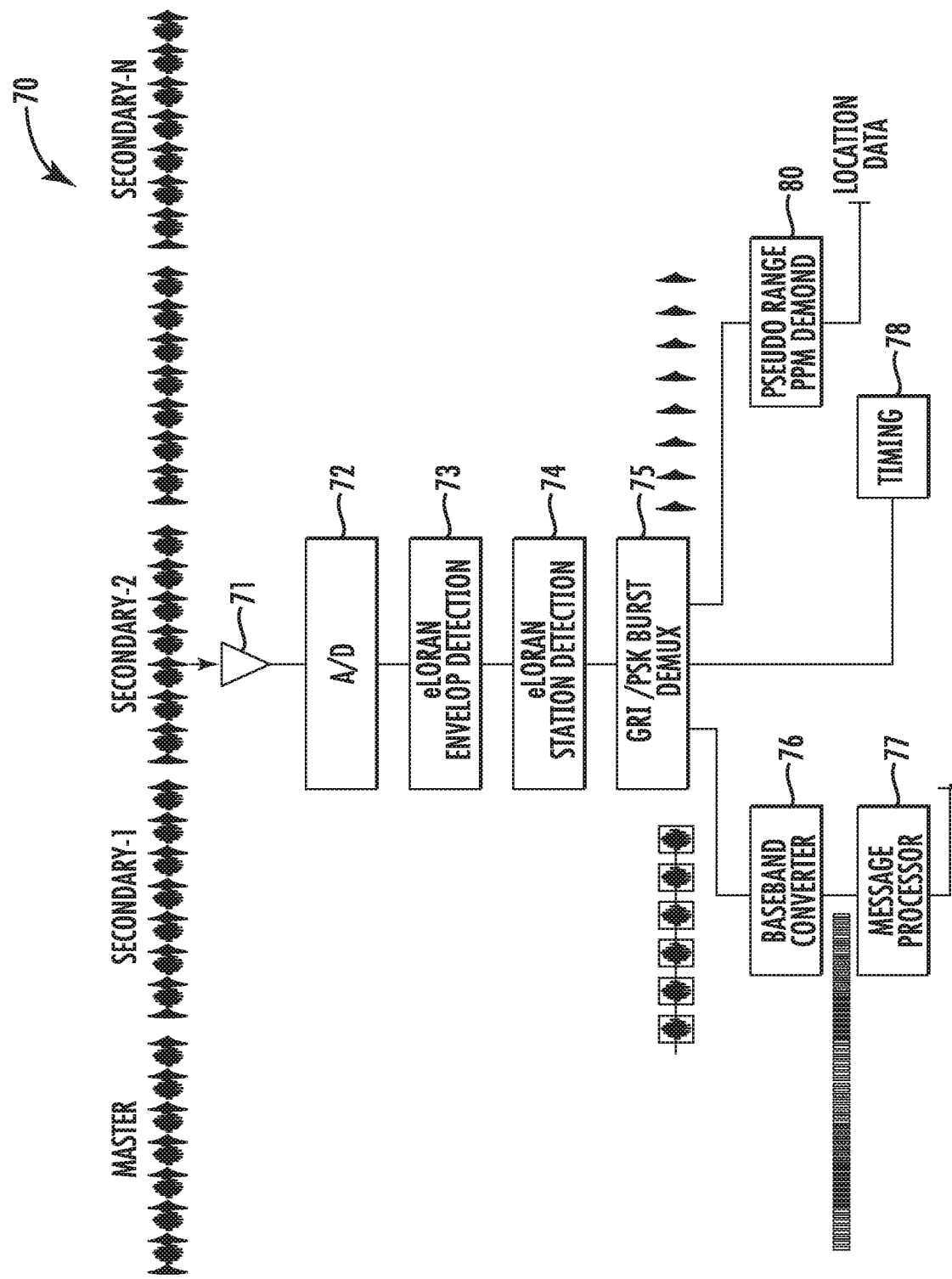
FIG. 7 is a schematic diagram of an example embodiment of a receiver chain in the LORAN receiving device from the RF PNT system of FIG. 3.
Figure 8:
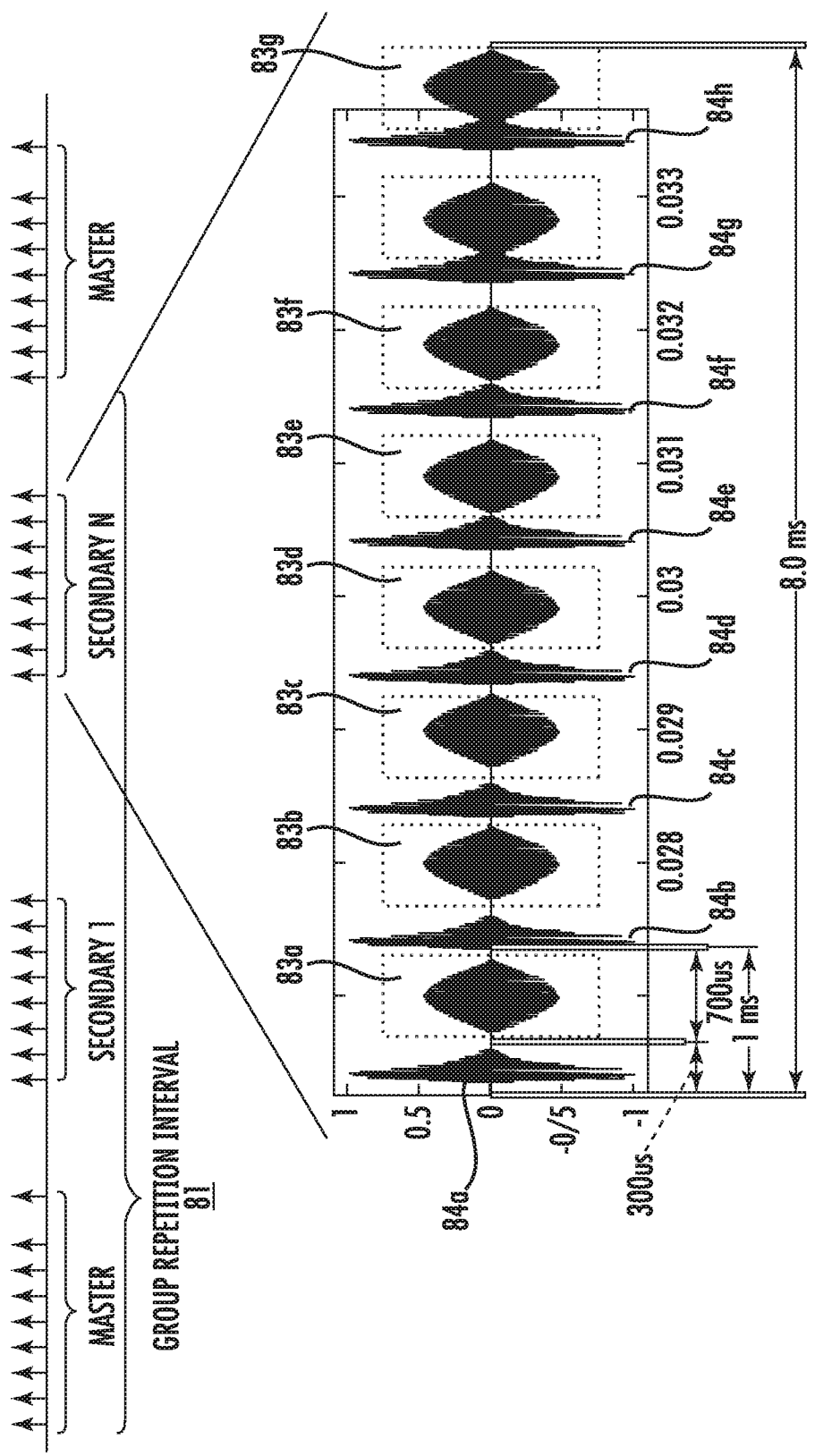
FIG. 8-10 are schematic diagrams of an example embodiment of a plurality of message RF bursts based upon an input message from the RF PNT system of FIG. 3.
Figure 9:
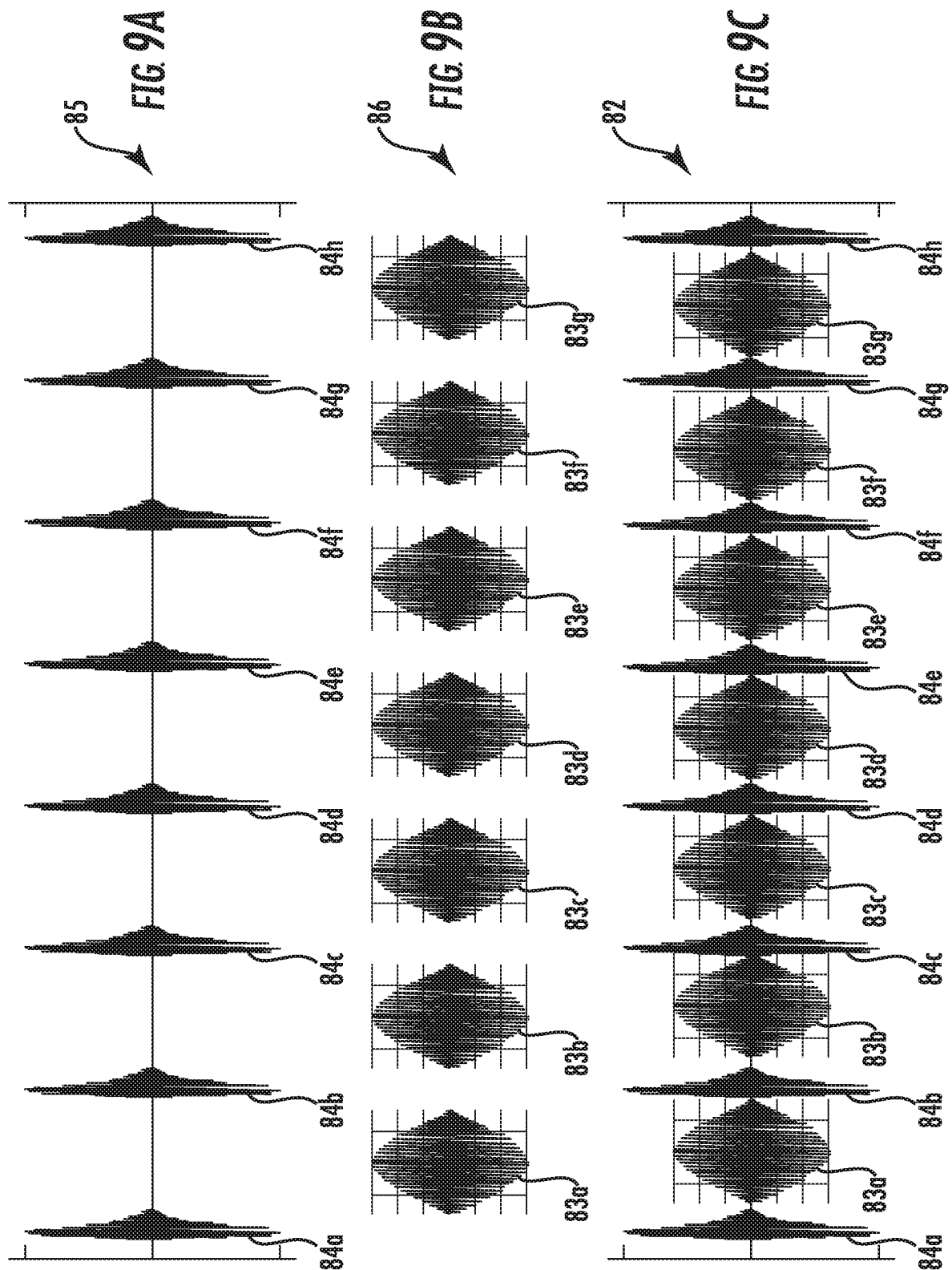

Referring now to FIG. 7, a diagram illustrates the receiver chain 70 of an exemplary embodiment of the LORAN receiving device (258: FIG. 5). The receiver chain 70 illustratively includes a LORAN antenna 71 configured to receive the plurality of message RF bursts and the series of LORAN PNT RF pulses, an analog-to-digital converter (ADC) 72 downstream from the LORAN antenna, a LORAN envelope detection module 73 downstream from the ADC, a LORAN station detection module 74 downstream from the LORAN envelope detection module, and a GRI burst demultiplexer module 75 coupled downstream from the LORAN station detection module. The receiver chain 70 illustratively includes a baseband converter module 76 and message processor module 77 downstream from the GRI burst demultiplexer module 75, a pseudo range module 80 downstream from the GRI burst demultiplexer module and configured to generate LORAN location data, and a timing module 78 downstream from the GRI burst demultiplexer module.

Referring now to FIGS. 3-4 and 8-9C, a combined waveform 82 of the plurality of message RF bursts 83a-83g and the series of LORAN PNT RF pulses 84a-84h within the GRI 81 is now described. The series of LORAN PNT RF pulses 84a-84h illustratively comprises a standard group of 8 pulses with 1 ms spacing. Each of the plurality of LORAN stations 41a-41g transmits 8 pulses separated by 1 ms, once per GRI. The LORAN receiving device (258: FIG. 5) integrates these pulses on a GRI-by-GRI basis, in order to improve signal-to-noise ratio (SNR) and thus improve position estimation accuracy. The RF PNT system 40 advantageously makes use of dead time between LORAN PNT RF pulses 84a-84h and defines them as time slots in a time-division multiple access (TDMA) messaging scheme for exchanging messages. In the illustrated example, each GRI 81 includes an eight RF burst messaging frame.

As perhaps best seen in FIGS. 9A-9C, the LORAN GRI 85 is combined with the messaging frame 86 to generate the combined waveform 82. Advantageously, the messaging frame 86 is easily extracted from the LORAN GRI 85 and is transparent to the LORAN user.

Helpfully, this technique provides additional data rate capacity that supplements the inherent low data rate capability of the eLoran LDC. Also, classic LORAN-C has no LDC, so this technique would provide a data communications channel for classic LORAN-C.

Figure 10:
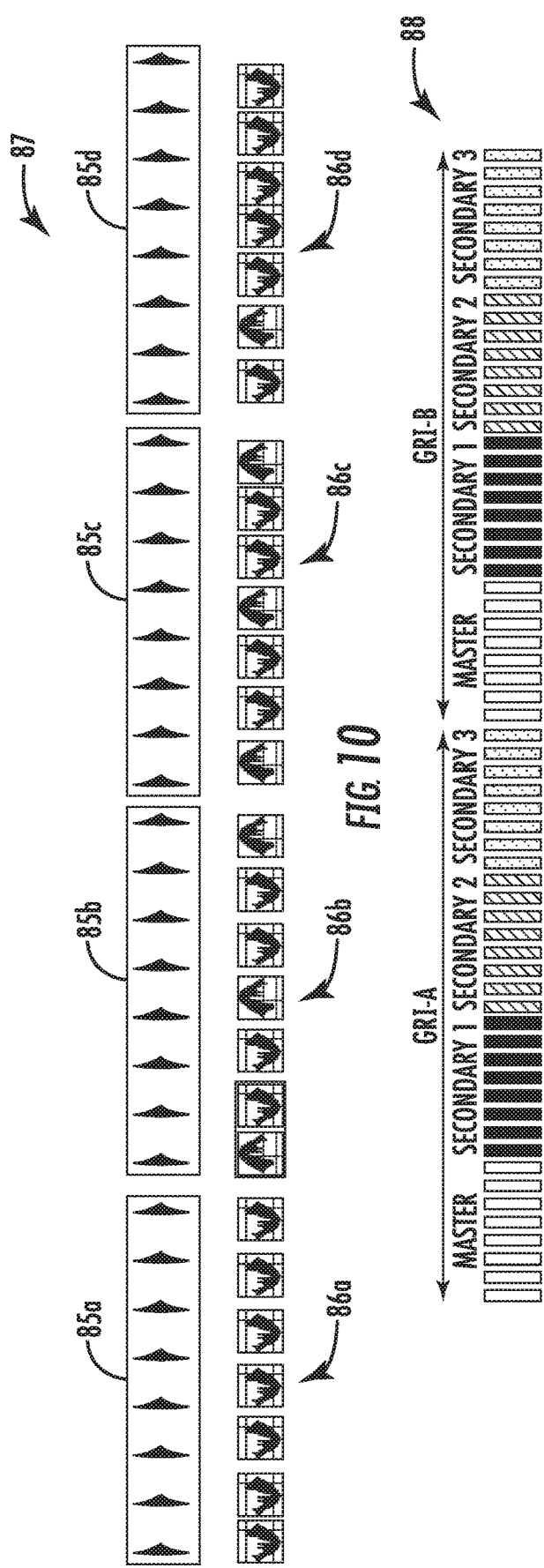

Referring now to FIG. 10, a diagram 87 shows the over-the-air composite waveform in an exemplary embodiment of the RF PNT system 40. The over-the-air composite waveform illustratively includes a plurality of LORAN GRIs 85a-85d, and a plurality of message frames 86a-86d. In particular, continuous message packets can adaptively be interleaved into successive navigation pulse groups (i.e. LORAN GRIs 85a-85d), from different transmitting sites. In other words, different messages from different sources could be embedded into the plurality of LORAN GRIs 85a-85d. The exemplary embodiment of the RF PNT system 40 is implementing a TDMA communication method within the LORAN system. As shown, no data signals are transmitted between pulse groups in the plurality of message frames 86a-86d to minimize cross-rate interference (CRI).

Figure 11:
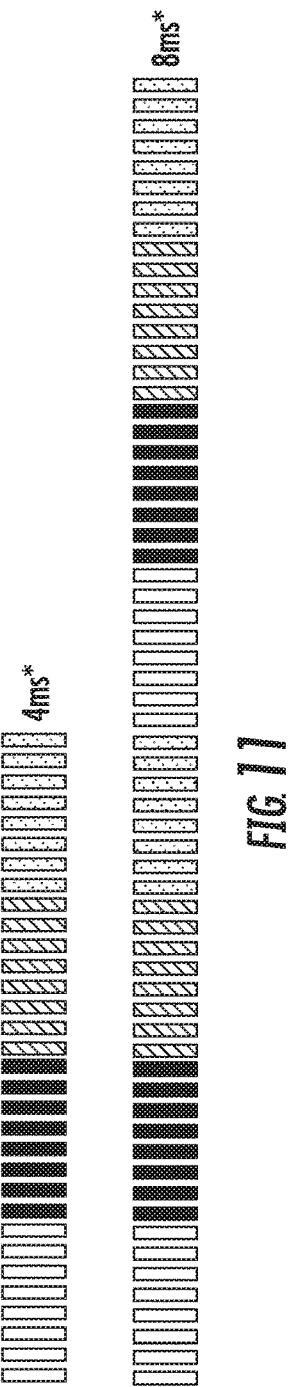
FIG. 11 is a schematic diagram of an example embodiment of a messaging layer GRI translation to time-division multiple access from the RF PNT system of FIG. 3.

Referring now to FIG. 11, a diagram 88 shows a messaging layer 2 concept GRI translation to LF TDMA in an exemplary embodiment of the RF PNT system 40. As shown, the RF PNT system 40 transforms LF bursts into classical TDMA defined time slots, packets, frames, and/or epochs.

Figure 12:
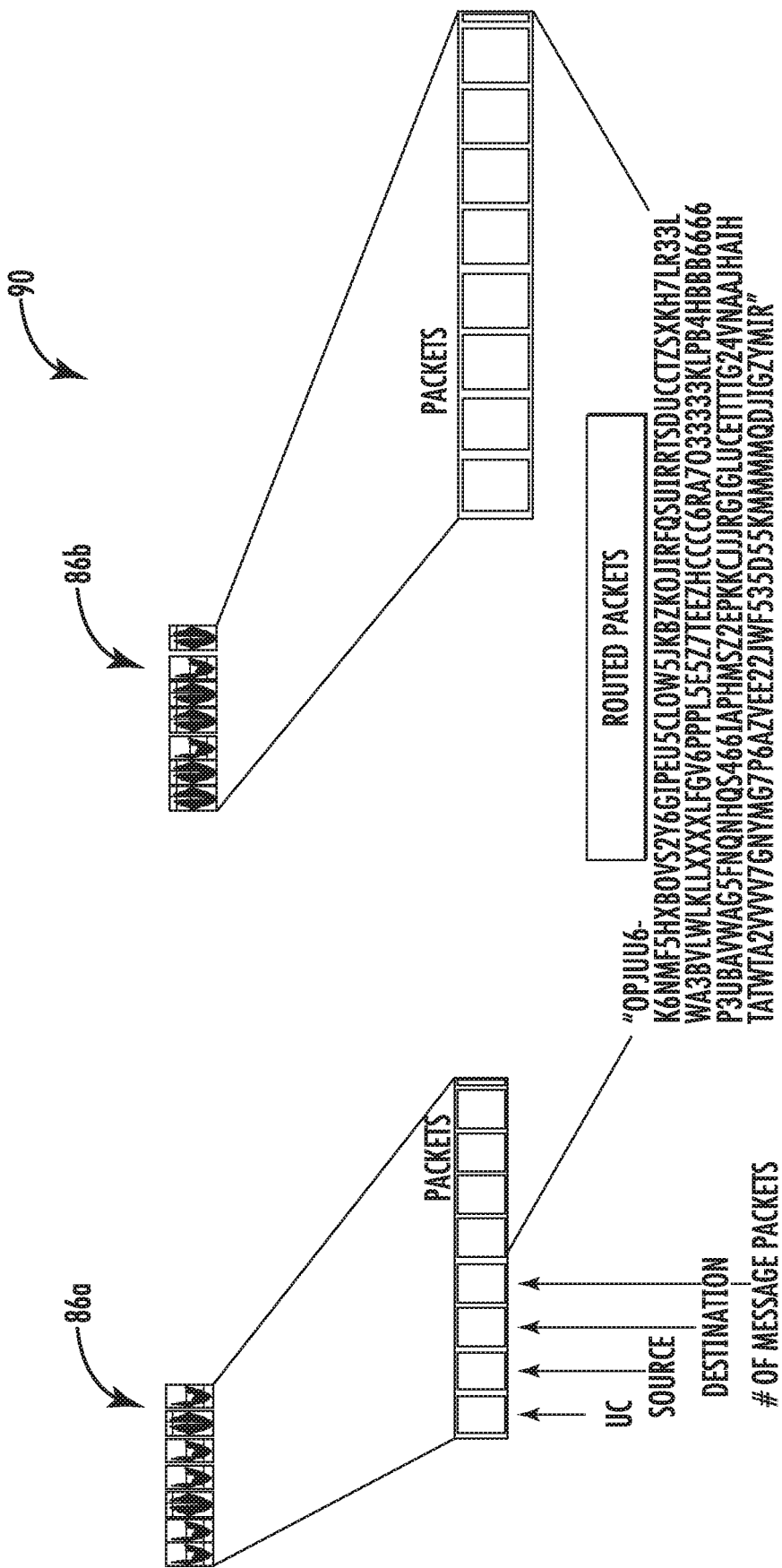
FIG. 12 is a schematic diagram of an example embodiment of routed packets from the RF PNT system of FIG. 3.

Referring now to FIG. 12, a diagram 90 shows a messaging layer 2 concept GRI translation to LF message packets in an exemplary embodiment of the RF PNT system 40. As shown, the RF PNT system 40 transforms LF bursts into an efficient TDMA format.

Advantageously, the RF PNT system 40 as described herein provides potential benefits over typical LORAN communication systems. In particular, the RF PNT system 40 may provide: a fixed time TDMA networked communication channel multiplexed within the LORAN signaling schema for the transmission of non-position, timing and navigation (non-PTN) data; a multiplexed, adaptive on demand, assigned access, TDMA networked communication channel within the LORAN signaling schema for the transmission of non-PTN data LORAN GRI pulse used for carrier acquisition for preamble-less QPSK demodulation; an efficient bi-directional peer-to-peer messaging between LORAN transmitter stations; an efficient unidirectional messaging to client nodes via networked communications channel; an efficient routing protocol for multi-hop data message transport within GRI string (single network cloud); an efficient routing protocol for multi-hop routing within multiple GRI strings (multiple network cloud); an efficient routing protocol for multi-hop routing within multiple heterogeneous clouds; an adaptive on-demand data channel access scheme for transport of messages; a Quality of Service (QoS) scheme for priority messaging; a secure type-1 encryption transparent core network for the transport of multiple security levels (enclaves) with in a single GRI string (homogenous); a secure type-1 encryption transparent core network for the transport of multiple security levels within a heterogeneous network; a FEC channel coding using modern techniques (e.g., LDPC, with interleaving option and/or RS); a modern high-order modulation techniques (e.g., M-QAM, such as 16-QAM); and a MSK waveform or spectral shaping of pulses using root-raised-cosine (RRC) in order to permit a much higher data rate (e.g., 10 kbps) that will fit within the existing LORAN 20 kHz bandwidth (BW) allocation (99% power mask rule).

As noted above, the LDC in typical applications suffers from a low data rate. Since the existing world-wide LORAN bandwidth allocation is unlikely to expand, the RF PNT system 40 provides an approach to address this low data rate issue. The RF PNT system 40 may provide an approach to this low data rate issue by inserting periodic data bursts between the existing navigation pulses of each pulse group transmitted by each transmitter in the LORAN system. These data bursts will augment the current (pulse position modulation (PPM) based) existing data rate capacity of the LDC to provide the needed aggregate LOC data rate to support the dynamic ASF corrections collected by the larger number of reference stations. In other words, the position/location data provided in the RF PNT system 40 may be more accurate since more ASF corrections can now be sent more frequently. The data bursts will employ modern forward error FEC channel coding techniques (e.g., LDPC, RS), and modern data modulation methods (e.g., M-ary QAM, MSK), and data pulse spectral shaping (e.g., RRC filter or BW-efficient MSK) in order to increase the utilization of the current LORAN bandwidth allocation by increasing the symbol rate.

Using RRC shaping essentially flattens the spectrum across the allocated spectrum, and thus makes efficient use of the allocated spectrum (i.e. RRC shaping of transmitted signal to maximize the use of the allocated 20 kHz BW, while not exceeding the 25 dB down requirement at f=100±10 kHz). However, the LORAN transmitter antenna system BW is limited to several kHz, so pre-emphasis of the signal spectrum prior to feeding to the transmitter tower may be required to fully utilize the full 20 kHz BW.

Figure 13:
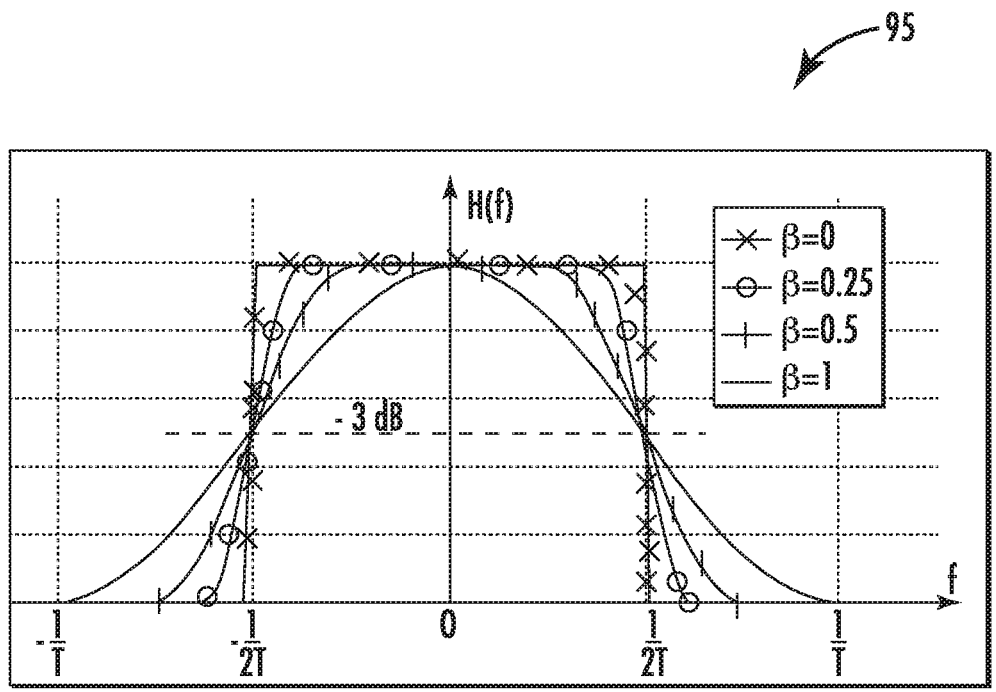
FIG. 13 is a spectral diagram for an example embodiment of the RF PNT system of FIG. 3.

Referring now to FIG. 13, a diagram 95 shows spectral shaping with the RRC filter. The RRC filter shaping permits better use of limited BW (more power/Hz). For a given channel symbol rate, RRC shaping compacts the signal energy into a narrower bandwidth. The RRC filter permits the channel symbol rate to be increased, while observing the BW constraint. (See Tables 1-2). Note that spectral shaping results in a nonconstant envelope, which may require the use of a linear amplifier. Nonconstant envelope waveforms may be characterized by its Peak-to-Average-Power-Ratio (PAPR). It should also be noted that certain waveforms (e.g., M-QAM) are inherently nonconstant in envelope.

TABLE 1

Peak-to-Average Power (PAPR) Ratio Impacts; PAPR of the constellations for different modulation schemes

| Modulation | PAPR |
|---|---|
| N-PSK | 0 dB |
| 16-QAM | 2.6 dB |
| 32-QAM | 2.3 dB |
| 64-QAM | 3.7 dB |
| 128-QAM | 4.3 dB |

TABLE 2

PAPR of the RRC filter for different α values

| β | PAPR |
|---|---|
| 0.15 | 6.3 dB |
| 0.2 | 5.6 dB |
| 0.3 | 4.5 dB |
| 0.4 | 3.5 dB |
| 0.5 | 2.8 dB |

Figure 14A:
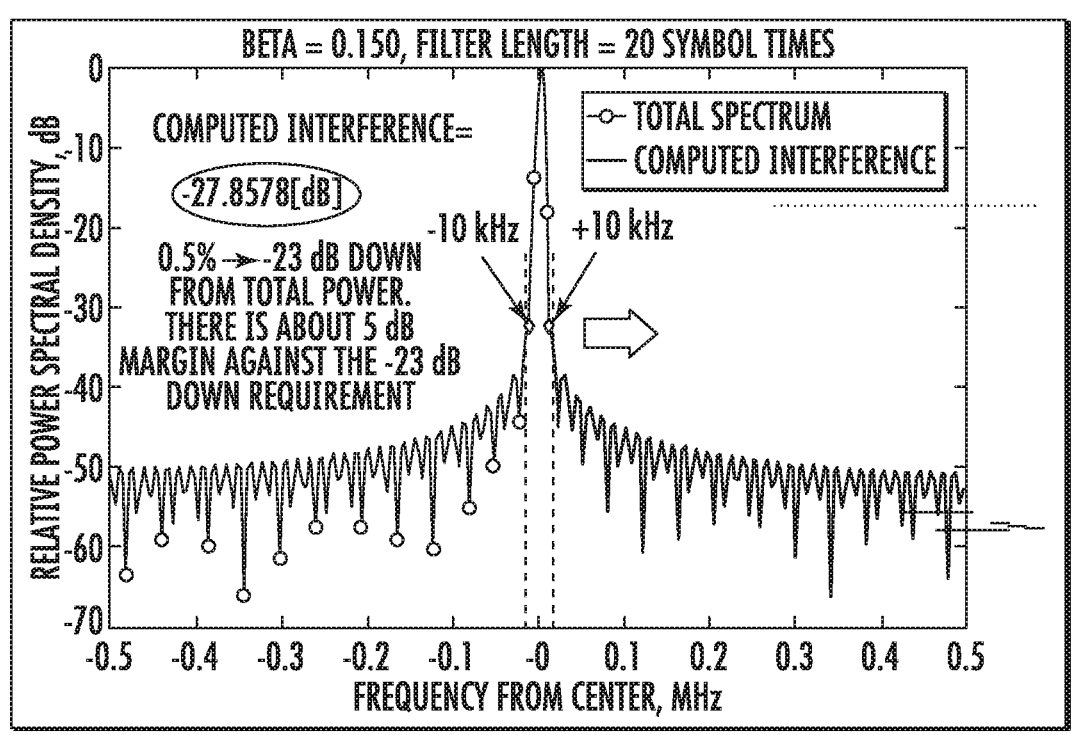
FIGS. 14A-16 are diagrams showing spectral shaping for the example embodiment of the RF PNT system of FIG. 3.
Figure 14B:
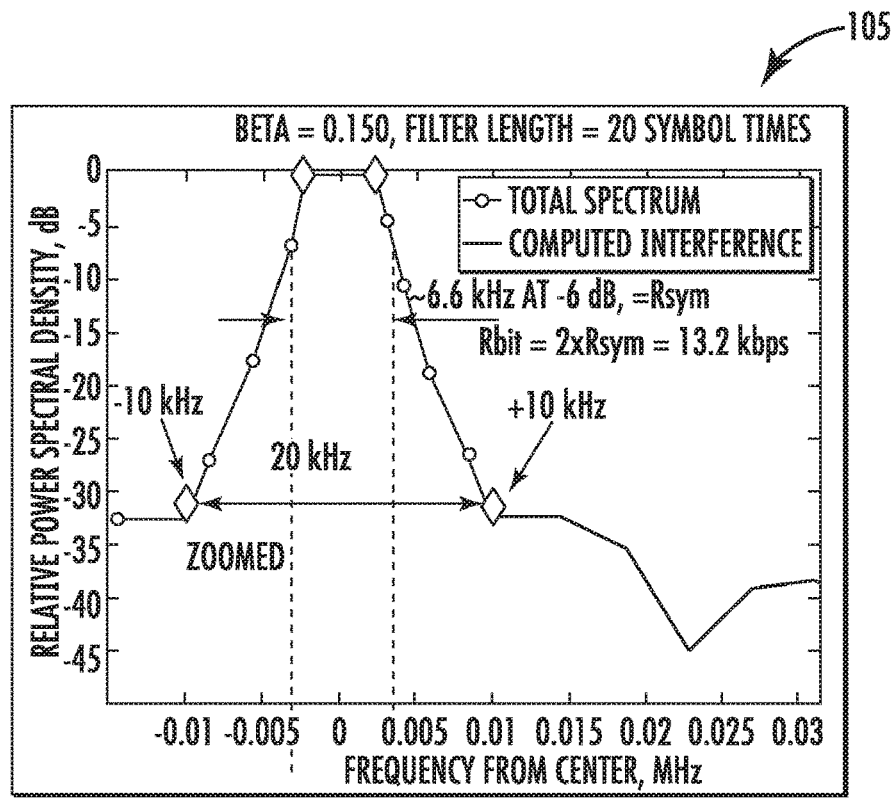

Referring now to FIGS. 14A-14B, diagrams 100, 105 show that RRC spectral shaping of Binary Phase Shift Keying (BPSK) or QPSK meets the 1% rule (i.e. 1% of total power is the maximum out-of-band power permitted) if the symbol rate is 6.6 kbps. The computed one-sided out-of-band (OOB) power is down −27.8578 dB. There is about 5 dB margin against the −23 dB down requirement (0.005 of total RF power is OOB on one side of RF spectrum to meet the 1% OOB power mask requirement). Recall that for uncoded BPSK, $R_{bit}=R_{symbol}$, and for uncoded QPSK, $R_{bit}=2 \times R_{symbol}$.

Figure 15:
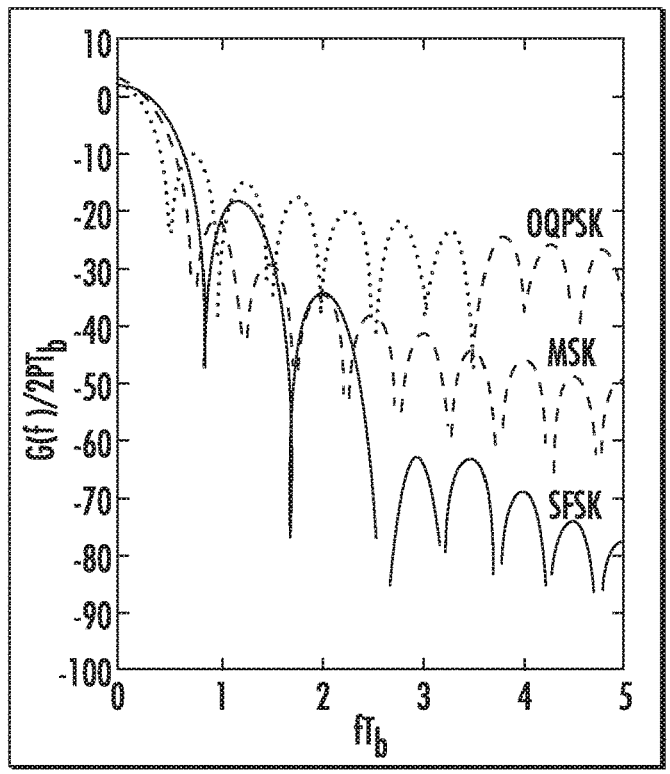
Figure 16:
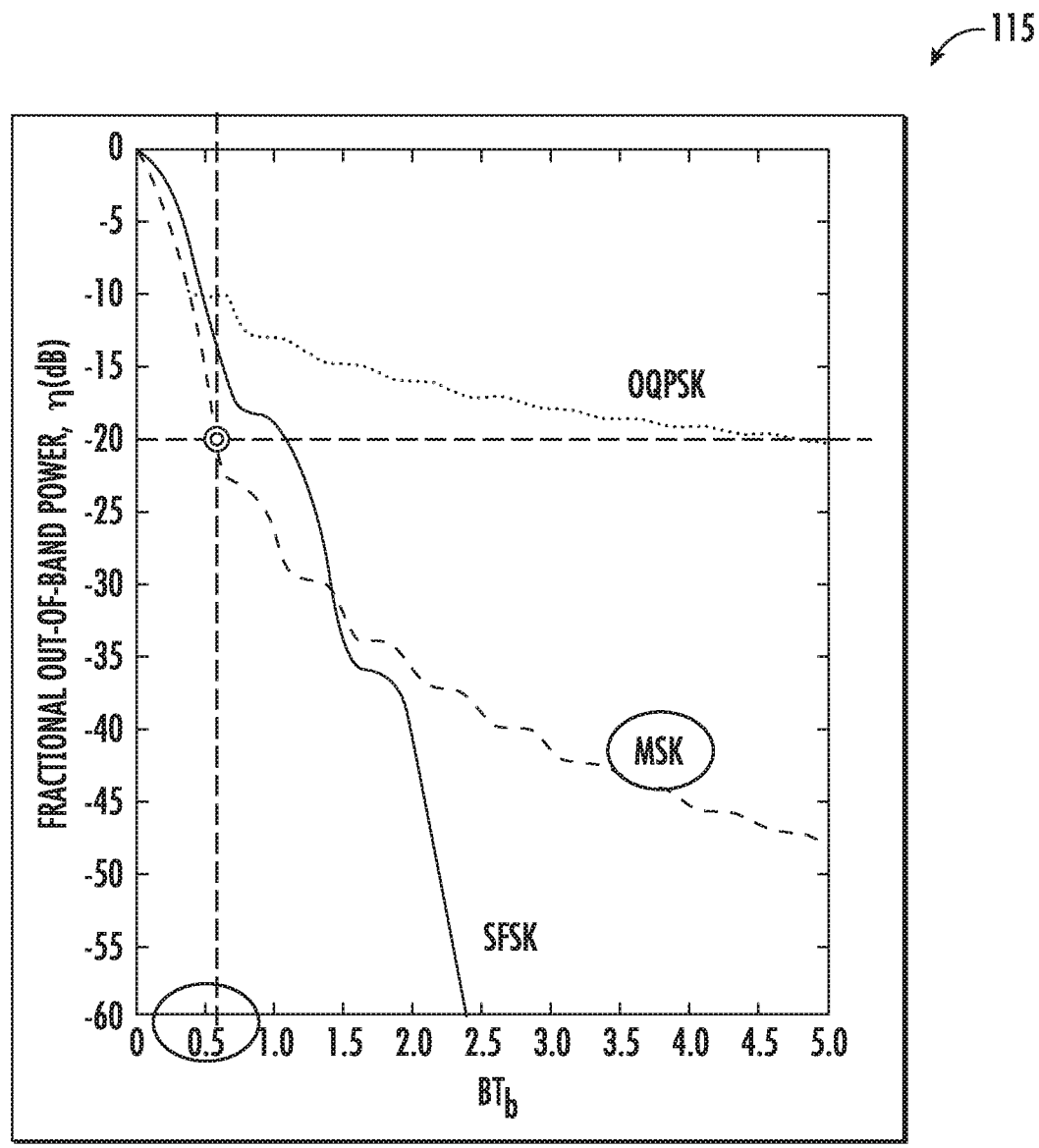

Referring now to FIGS. 15-16, diagram 110 shows the baseband spectra for OQPSK, MSK, and SFSK, and a diagram 115 shows the fractional OOB power for each modulation type. MSK modulation is the best performer at the 20 dB down level for OOB power. The base band MSK spectral shape meets the 1% OOB requirement at a one-sided baseband bandwidth of slightly higher than $0.5 \times R_{symbol}$, or approximately $0.55 \times R_{symbol}$. Since $BT_{bit}$=bandwidth normalized by bit rate $R_{bit}$, then $B/R_{bit}=0.55$, or $R_{bit}=10/0.55$ kHz=18.18 kbits/sec. Since for MSK, each symbol conveys two bits, the MSK symbol rate $R_{symbol}=R_{bit}/2=9.1$ kbps.

Figure 17A:
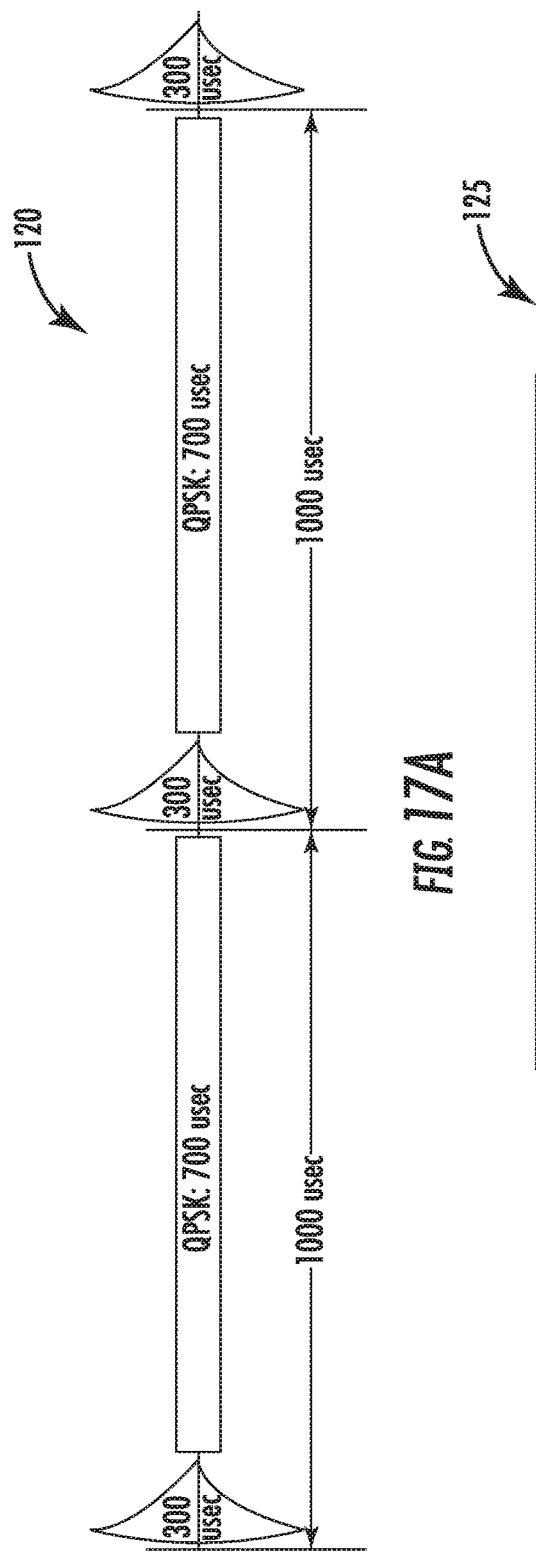
FIGS. 17A-17B are diagrams showing adding quadrature phase shift keying bursts between pulses for the example embodiment of the RF PNT system of FIG. 3.
Figure 17B:
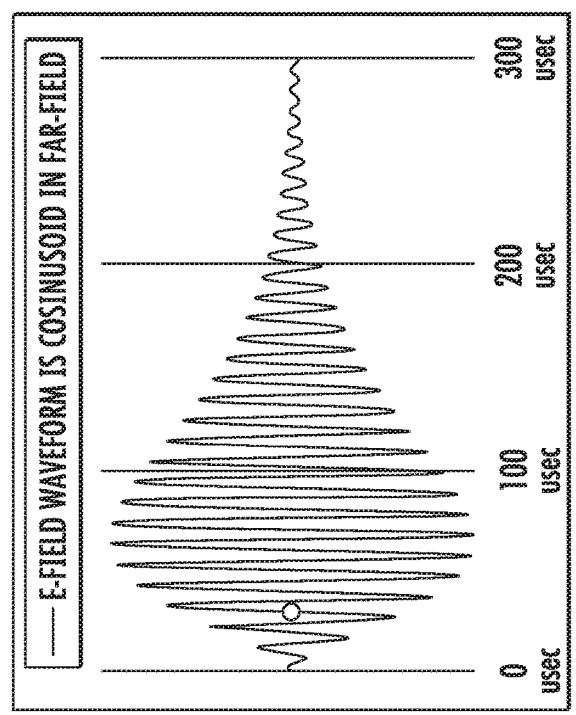

Referring now to FIGS. 17A-17B, diagram 120 shows, as an example, the addition of QPSK data bursts between the series of LORAN PNT RF pulses. Diagram 125 shows that a LORAN PNT RF pulse occupies 300 microseconds, leaving 700 microseconds available for data transmission between pulses. To calculate the effective data rate, the QPSK On-Time Duration per GRI per transmission:

$8 \times 700$ μs$\gg 5.6$ ms/$T_{GRI}$

Minimum GRI duration=4000×10=40,000 μsec=0.04 s

Maximum GRI duration=9990×10=0.0999 sec~0.1 s

Data rate(@1 kbps user data rate, R=½ coding$\gg$2 kbps channel data rate after coding)

For minimum GRI: 1 kbps user data rate×5.6 ms/40 ms=140 bps channel data rate after coding For maximum GRI: 1 kbps user data rate×5.6 ms/100 ms=56 bps channel data rate after coding To increase data rate, a higher order modulation (M-QAM) may be used, or transmitting QPSK/QAM messages between pulse groups, but this leads to higher CRI or self-interference.

Using RRC, α=0.15, a 10 kbps signal fills the allocated 20 kHz BW, while meeting the 99% radiated power containment constraint; this will require some pre-emphasis at BW edges to compensate the narrow BW of the transmit antenna. For QPSK, R=½ FEC, the average data rate per transmitter becomes two times greater than in the 1 kbps example shown above: 1400 bps, 560 bps, for GRI=4000, 9990, respectively.

The average transmitter power value will increase due to the increased "on-time" for each transmitter due to the addition of QPSK signals between existing LORAN pulse signals. Pulses are spaced at 1 ms (1000 μsec) intervals, and since pulse duration is ~300 μsec, there is 700 μsec of available time between pulses to provide QPSK. If it is assumed that the "equivalent" constant envelope power of a pulse would endure for about 100 μsec (recalling that pulse peak is at 65 μsec), then the duty cycle within an 8-pulse group would increase from 100/1000 (10%) to (100+700)/1000=80%, or an eight times increase in average power. For the same transmitter capability, this implies that the power for the pulses would have to be reduced by eight times, a high price to pay in power consumed. However, if the power of the QPSK signals were decreased by ten compared to pulse power, the power penalty would be much reduced to (100+700/10)/1000=1.7x. This may be permissible for the QPSK signal since this communication signal has FEC coding and low burst data rate.

A typical LORAN tower height limits the 3 dB bandwidth to approximately 2 or 3 kHz, without shunt peaking (i.e., stagger-tuned pre-emphasis of signal). Thus, if QPSK and Rate ½ coding and a raw data rate before coding of 1 kbps is used (2000 channel bits), then the null-to-null bandwidth of the coded QPSK signal will be 1×2 kbps=2 kHz. If RRC shaping (α=0.2) of the signal is employed, then the RF 3 dB bandwidth will be on the order of 1.2×Rs (symbol rate=1.2×1 kbps=1.2 kHz, where α=0.2 is the excess bandwidth factor). With proper pre-emphasis of the signal applied to the antenna, the data rate could be increased, since the radiated LORAN signal has a 3 dB BW of ~5 kHz. With additional signal pre-emphasis or taller antenna, the data rate could perhaps be increased to 10 kbps. This may have a dramatic positive impact on the LDC data rate.

Figure 18:
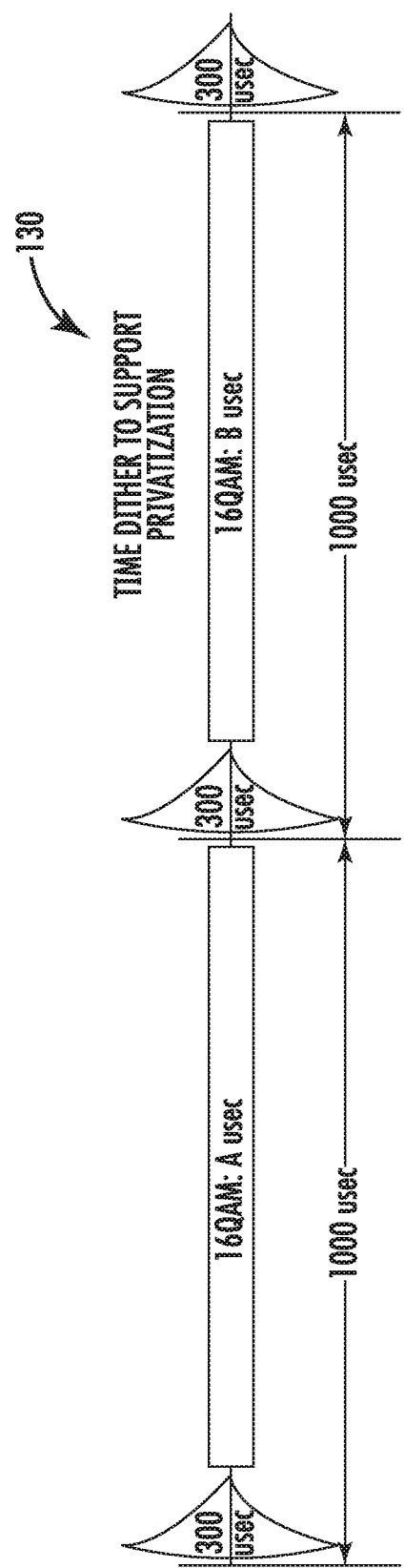
FIG. 18 is a diagram showing adding 16-quadrature amplitude modulation bursts between pulses for the example embodiment of the RF PNT system of FIG. 3.
Figure 19:
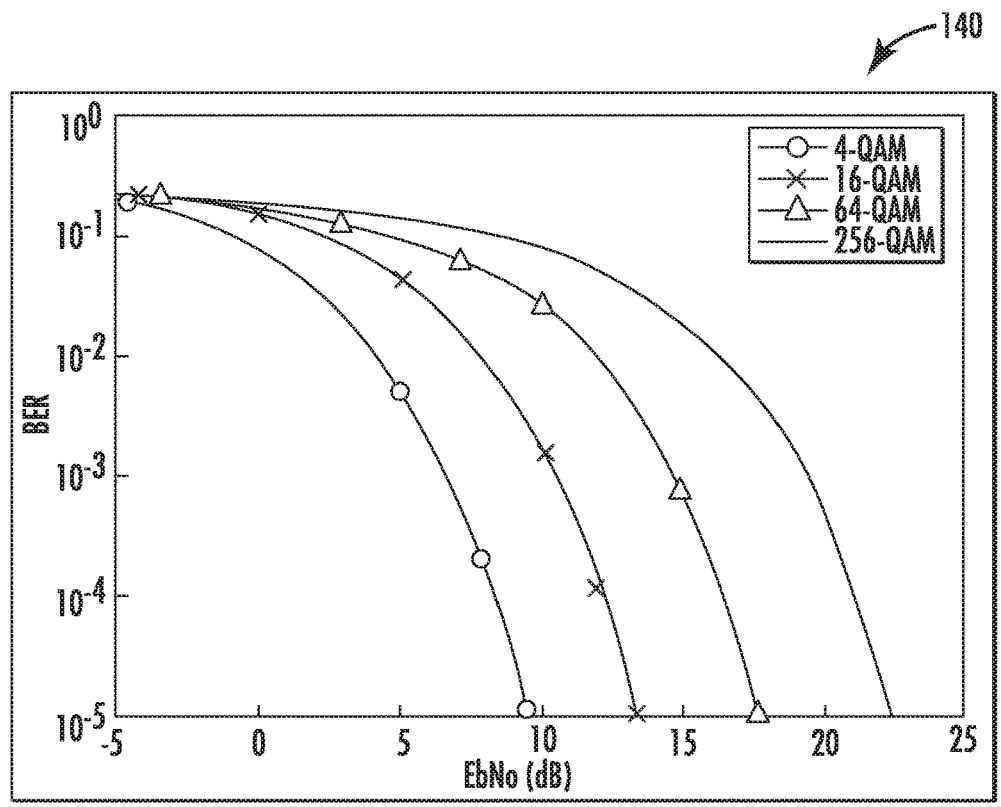
FIGS. 19-22 are diagrams showing respective system performance metrics for the example embodiment of the RF PNT system of FIG. 3.
Figure 20:
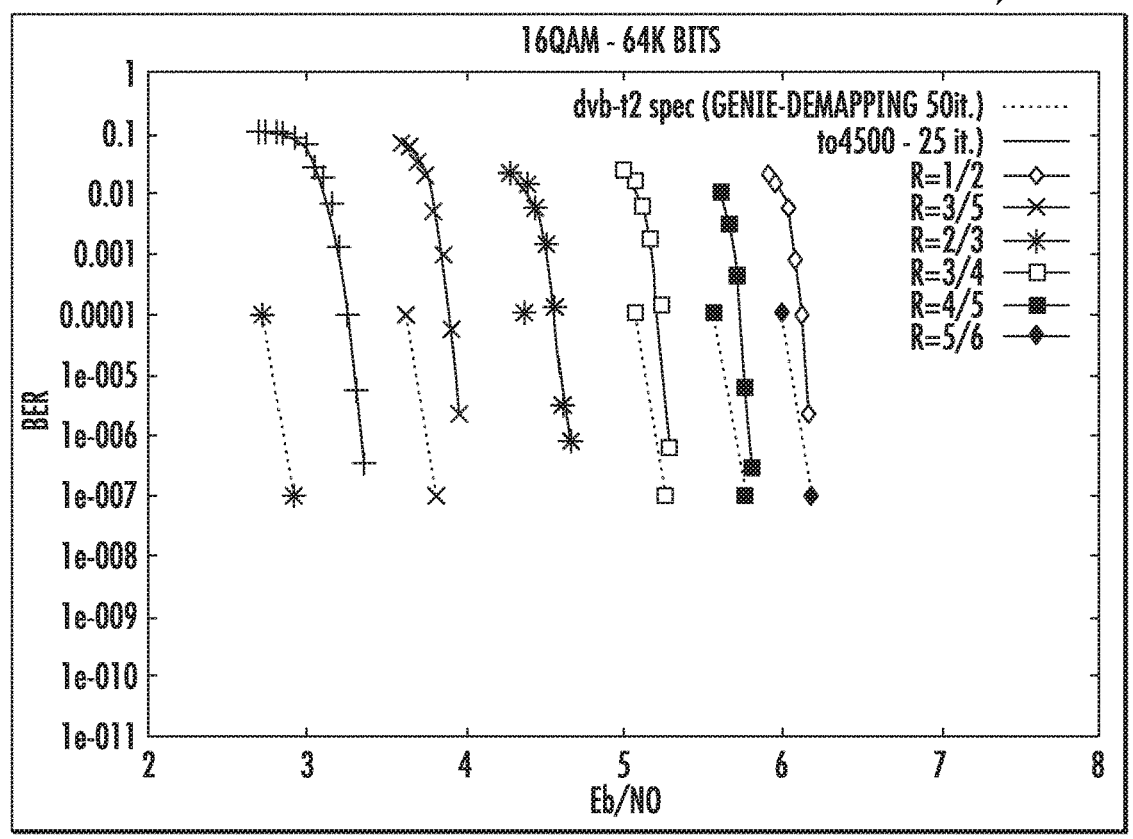
Figure 21:
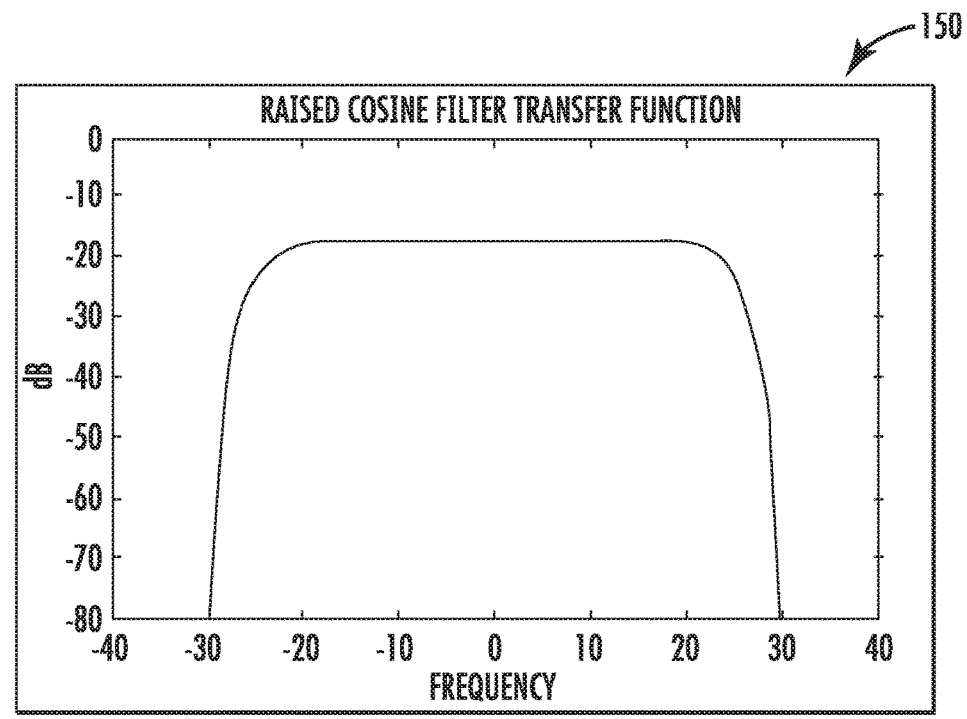
Figure 22:
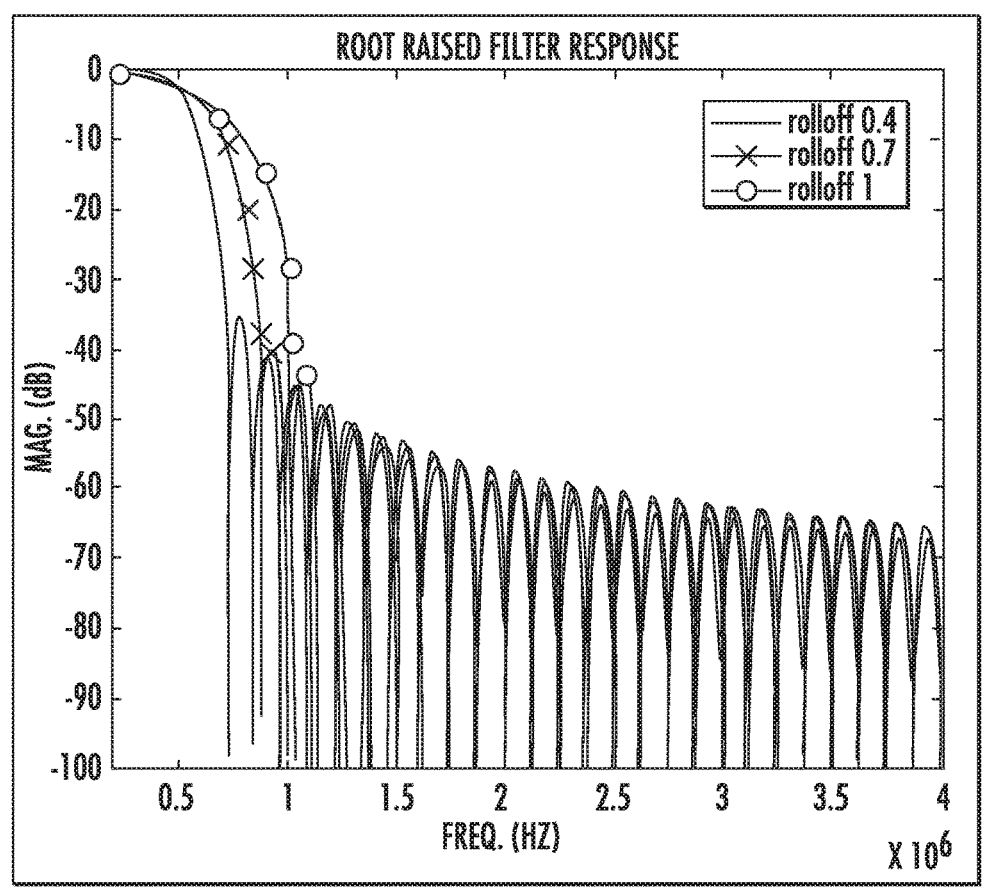

Referring now to FIG. 18, diagram 130 shows the addition of 16-QAM data bursts between the series of LORAN PNT RF pulses. If the pulses need to be pseudorandomly staggered to provide privatization, the space between successive pulses is also pseudorandom. Therefore, to maximize use of the dynamically changing inter pulse space, the M-QAM burst duration must dynamically adapt to the available "white space" between pulse pairs. However, the net data throughput will remain the same.

Referring now to FIGS. 19-22, diagram 140 shows higher order example bit error rates for several QAM modulations (4-QAM, 16-QAM, 64-QAM, 256-QAM). Diagram 145 shows the BER using FEC. Diagram 150 shows a frequency transfer function for the RRC filter with baud=50, and α=0.2. Diagram 155 shows the effect of RRC shaping versus excess BW (or rolloff) parameter.

Other features relating to communication systems are disclosed in co-pending application Ser. No. 16/114,668, titled "POSITION DETERMINING SYSTEM AND ASSOCIATED METHODS HAVING DIFFERENT ACCURACY LEVELS," which is incorporated herein by reference in its entirety, now abandoned.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. A radio frequency (RF) Precision Navigation and Timing (PNT) system comprising:
   a plurality of LOng RAnge Navigation (LORAN) stations each LORAN station comprising
      a LORAN antenna, and
      a LORAN transmitter coupled to said LORAN antenna and configured to transmit a series of LORAN PNT RF pulses within a Group Repetition Interval (GRI) and having a time spacing between adjacent LORAN PNT RF pulses, the time spacing within the GRI defining time slots in a time-division multiple access (TDMA) messaging scheme;
   said plurality of LORAN stations comprising a first group of said plurality of LORAN stations, each comprising
      a message embedding generator coupled to said LORAN transmitter and configured to
         generate an encrypted message based upon an input message, and
         modulate the encrypted message by generating a plurality of message RF bursts based upon the encrypted message, and with each message RF burst being in the time slots between respective adjacent LORAN PNT RF pulses, a time spacing between adjacent message RF bursts being pseudo-randomized;
   said first group of LORAN stations configured to transmit the plurality of message RF bursts in a synchronized arrangement with one another.

2. The RF PNT system of claim 1 wherein said message embedding generator is configured to generate the plurality of message RF bursts to be uncorrelated from the series of LORAN PNT RF pulses.

3. The RF PNT system of claim 1 wherein each LORAN transmitter is configured to transmit eight LORAN PNT RF pulses in the GRI; and wherein said message embedding generator is configured to generate the plurality of message RF bursts using a fixed frame arrangement based upon the GRI.

4. The RF PNT system of claim 1 wherein each LORAN transmitter is configured to transmit eight LORAN PNT RF pulses in the GRI; and wherein said message embedding generator is configured to generate the plurality of message RF bursts using an adaptive frame arrangement based upon the GRI.

5. The RF PNT system of claim 1 wherein said message embedding generator is configured to generate the plurality of message RF bursts using quadrature phase shift keying modulation.

6. The RF PNT system of claim 1 wherein said plurality of LORAN stations comprises a second group of LORAN stations configured to relay the input message from a message source to the first group of LORAN stations to be modulated into the plurality of message RF bursts.

7. The RF PNT system of claim 6 wherein the first group of LORAN stations is configured to send an acknowledgement message back to the message source.

8. The RF PNT system of claim 1 wherein said message embedding generator is configured to generate the plurality of message RF bursts based upon a message format comprising a routing preamble, a message type preamble, an encryption code segment, a reply or do not reply instruction, a digitally encoded message based upon an input message from a message source, and at least one of a checksum and a cyclic redundancy check (CRC) of message bits.

9. The RF PNT system of claim 1 further comprising a receiving device configured to receive at least the plurality of message RF bursts.

10. The RF PNT system of claim 9 wherein said receiving device is also configured to receive the series of LORAN PNT RF pulses.

11. The RF PNT system of claim 1 further comprising a timing module configured to combine the plurality of message RF bursts with the series of LORAN PNT RF pulses.

12. A LOng RAnge Navigation (LORAN) station in a first group from a plurality of LORAN stations, the LORAN station comprising:
   a LORAN transmitter configured to transmit a series of LORAN Precision Navigation and Timing (PNT) RF pulses within a Group Repetition Interval (GRI) and having a time spacing between adjacent LORAN PNT RF pulses, the time spacing within the GRI defining time slots in a time-division multiple access (TDMA) messaging scheme; and
   a message embedding generator coupled to said LORAN transmitter and configured to
      generate an encrypted message based upon an input message, and
      modulate the encrypted message by generating a plurality of message RF bursts based upon the encrypted message and with each message RF burst being in the time slots between respective adjacent LORAN PNT RF pulses, a time spacing between adjacent message RF bursts being pseudo-randomized;
   the first group of LORAN stations configured to transmit the plurality of message RF bursts in a synchronized arrangement with one another.

13. The LORAN station of claim 12 wherein said message embedding generator is configured to generate the plurality of message RF bursts to be uncorrelated from the series of LORAN PNT RF pulses.

14. The LORAN station of claim 12 wherein said LORAN transmitter is configured to transmit eight LORAN PNT RF pulses in the GRI; and wherein said message embedding generator is configured to generate the plurality of message RF bursts using a fixed frame arrangement based upon the GRI.

15. The LORAN station of claim 12 wherein said LORAN transmitter is configured to transmit eight LORAN PNT RF pulses in the GRI; and wherein said message embedding generator is configured to generate the plurality of message RF bursts using an adaptive frame arrangement based upon the GRI.

16. The LORAN station of claim 12 wherein said message embedding generator is configured to generate the plurality of message RF bursts using quadrature phase shift keying modulation.

17. The LORAN station of claim 13 further comprising a timing module configured to combine the plurality of message RF bursts with the series of LORAN PNT RF pulses.

18. A LOng RAnge Navigation (LORAN) receiving device to be used with a LORAN station comprising a LORAN transmitter configured to transmit a series of LORAN Precision Navigation and Timing (PNT) RF pulses within a Group Repetition Interval (GRI) and having a time spacing between adjacent LORAN PNT RF pulses, the time spacing within the GRI defining time slots in a time-division multiple access (TDMA) messaging scheme, and a message embedding generator coupled to said LORAN transmitter and configured to generate an encrypted message based upon an input message, and modulate the encrypted message by generating a plurality of message RF bursts based upon the encrypted message, and with each message RF burst being in the time slots between respective adjacent LORAN PNT RF pulses, the LORAN station configured to transmit the plurality of message RF bursts in a synchronized arrangement with a first group of LORAN stations, the LORAN receiving device comprising:
 a LORAN receiving antenna;
 LORAN receiver circuitry coupled to said LORAN antenna and configured to recover the series of LORAN PNT RF pulses having the time spacing between respective adjacent LORAN PNT RF pulses; and
 message recovery circuitry coupled to said LORAN receiver circuitry and configured to decrypt the encrypted message and recover the input message from the plurality of message RF bursts, with each message RF burst being in the time spacing between respective adjacent LORAN PNT RF pulses, a time spacing between adjacent message RF bursts being pseudo-randomized.

19. The LORAN receiving device of claim 18 wherein the plurality of message RF bursts are uncorrelated from the series of LORAN PNT RF pulses.

20. The LORAN receiving device of claim 18 wherein said message recovery circuitry is configured to demodulate the plurality of message RF bursts using quadrature phase shift keying demodulation.

21. A method for radio frequency (RF) Precision Navigation and Timing (PNT) and messaging, the method comprising:
 operating a plurality of LOng RAnge Navigation (LORAN) stations, each LORAN station comprising
  a LORAN antenna, and
  a LORAN transmitter coupled to the LORAN antenna and configured to transmit a series of LORAN PNT RF pulses within a Group Repetition Interval (GRI) and having a time spacing between respective adjacent LORAN PNT RF pulses, the time spacing within the GRI defining time slots in a time-division multiple access (TDMA) messaging scheme;
 operating a first group of the plurality of LORAN stations, each LORAN station comprising a message embedding generator coupled to the LORAN transmitter and configured to
  generate an encrypted message based upon an input message, and
  modulate the encrypted message by generating a plurality of message RF bursts based upon the encrypted message, and with each message RF burst being in the time slots between respective adjacent LORAN PNT RF pulses, a time spacing between adjacent message RF bursts being pseudo-randomized; and
 operating the first group of LORAN stations to transmit the plurality of message RF bursts in a synchronized arrangement with one another.

22. The method of claim 21 wherein the message embedding generator is configured to generate the plurality of message RF bursts to be uncorrelated from the series of LORAN PNT RF pulses.

23. The method of claim 21 wherein each LORAN transmitter is configured to transmit eight LORAN PNT RF pulses in the GRI; and wherein the message embedding generator is configured to generate the plurality of message RF bursts using a fixed frame arrangement based upon the GRI.

24. The method of claim 21 wherein each LORAN transmitter is configured to transmit eight LORAN PNT RF pulses in the GRI; and wherein the message embedding generator is configured to generate the plurality of message RF bursts using an adaptive frame arrangement based upon the GRI.

25. The method of claim 21 wherein operating the plurality of LORAN stations comprises operating a second group of LORAN stations configured to relay the input message from a message source to the first group of LORAN stations to be modulated into the plurality of message RF bursts.

26. The method of claim 21 further comprising operating a receiving device to receive at least the plurality of message RF bursts.

27. The method of claim 26 further comprising operating the receiving device to also receive the series of LORAN PNT RF pulses.

28. The method of claim 21 further comprising operating a timing module configured to combine the plurality of message RF bursts with the series of LORAN PNT RF pulses.

* * * * *